United States Patent [19]
Satoh et al.

[11] Patent Number: 5,979,475
[45] Date of Patent: Nov. 9, 1999

[54] SPECIMEN HOLDING METHOD AND FLUID TREATMENT METHOD OF SPECIMEN SURFACE AND SYSTEMS THEREFOR

[75] Inventors: Takao Satoh, Kawasaki; Haruo Itoh, Hino; Hitoshi Oka, Yokohama; Yoichi Takahara, Yokohama; Akio Saito, Yokohama, all of Japan

[73] Assignee: Hitachi, Ltd., Tokyo, Japan

[21] Appl. No.: 08/430,429

[22] Filed: Apr. 28, 1995

[30] Foreign Application Priority Data

Apr. 28, 1994 [JP] Japan .................................... 6-092568
Jan. 25, 1995 [JP] Japan .................................... 7-009962

[51] Int. Cl.$^6$ ...................................................... B08B 3/02
[52] U.S. Cl. ........................... 134/140; 134/153; 134/157; 134/201
[58] Field of Search .................... 134/157, 153, 134/140, 201; 118/319, 320

[56] References Cited

U.S. PATENT DOCUMENTS

| | | |
|---|---|---|
| 3,438,668 | 4/1969 | Olsson et al. . |
| 3,523,706 | 8/1970 | Logue . |
| 3,993,301 | 11/1976 | Vits . |
| 4,009,785 | 3/1977 | Trayes . |
| 4,029,351 | 6/1977 | Apgar et al. . |
| 4,202,071 | 5/1980 | Scharpf .................................... 134/199 |
| 4,903,717 | 2/1990 | Summnitsch ............................ 134/153 |
| 5,324,155 | 6/1994 | Goodwin et al. . |
| 5,370,709 | 12/1994 | Kobayashi . |
| 5,513,668 | 5/1996 | Summnitsch ........................... 134/157 |

FOREIGN PATENT DOCUMENTS

| | | |
|---|---|---|
| 53-29550 | 8/1978 | Japan . |
| 60-74438 | 4/1985 | Japan . |
| 4-45515 | 2/1992 | Japan . |
| 4-69420 | 11/1992 | Japan . |
| 5-211225 | 8/1993 | Japan . |
| 4-287922 | 10/1993 | Japan . |
| 5-347289 | 12/1993 | Japan . |

*Primary Examiner*—Frankie L. Stinson
*Attorney, Agent, or Firm*—Frohwitter

[57] ABSTRACT

A highly clean fluid treatment system having a small system volume is provided by using a Bernoulli holder to accomplish stable holding of a specimen in a simple configuration. A holder having a specimen hold face formed almost the same as a specimen or having a Bernoulli effect producing region and a region surrounding the Bernoulli region made of a specific combination of materials is used and fluid supply sources are connected to the holder for supplying one or more fluids containing a treatment agent of a specimen. Since a force for inhibiting a position shift occurs on the end face of the specimen 10, stable specimen holding is enabled. The space between the specimen and the holder where treatment is executed is narrow and fluid always flows from the treatment space to the outside. Therefore, the fluid treatment system of a small volume producing high treatment efficiency and minimizing the chances of recontamination of the specimen can be provided.

7 Claims, 23 Drawing Sheets

DISTANCE BETWEEN UPPER AND LOWER HOLDER
EXCLUDING THICKNESS OF SPECIMEN (hu + hℓ) [mm]

SPECIMEN HOLDING METHOD AND FLUID TREATMENT METHOD OF SPECIMEN SURFACE AND SYSTEMS THEREFOR

BACKGROUND OF THE INVENTION

1. Field of the Invention

This invention relates to a holding method of a plate-like specimen in a noncontact condition, a fluid treatment method of a specimen surface using the holding method, and systems for carrying out the methods and in particular to a holding method of a plate-like specimen in a noncontact condition, a fluid treatment method of a specimen surface using the holding method, and systems for carrying out the methods appropriate for a thin-film device manufacturing process, etc., requiring cleanness.

2. Description of the Related Art

In recent years, thin-film devices such as semiconductors and liquid crystal displays have advanced in microstructures, and demands for high performance of their manufacturing technologies and a highly clean manufacturing process have increased. For example, thin-film devices of semiconductors require that the foreign material with the size 0.3 $\mu$m or more should be removed, that the adsorptive ion amount should be less than $10^9$ atoms/cm$^2$, and that the thickness of an oxide film formed on exposure to air should be 1 nm or less. Although thin-film device substrates at the manufacturing time become large-sized, demands for preventing an increase in the system volume and low costs of systems also increase. Further, drastic improvement in the processing speed is desired.

A method of processing substrate specimens (simply called specimens) one at a time, called single wafer processing, is available as one specific measure for meeting the demands; for example, it is put into practical use in a film formation step, etc., of a semiconductor manufacturing process.

However, the state-of-the-art single wafer processing system does not satisfy all the demands. This point will be discussed separately for each of specimen holding and treatment.

The main specimen holding methods in single wafer processing include a method of placing a specimen on a holder, a method of adsorbing and holding a specimen by vacuum chuck, and a method of mechanically grasping a specimen end. However, in every method, the holder comes in direct contact with the specimen. Thus, the contact part of the specimen is contaminated, leading to one source of an increase in the defective product occurrence rate. Since spatial restrictions for an operation drive and power transmission path are placed on the holder and transfer device, the treatment system becomes larger and complicated.

A specific example related to the single wafer processing method is given in Japanese Patent Laid-Open No. Hei 4-287922, which will be hereinafter called the first conventional example, wherein a specimen is fixed by substrate rotation means (spin chuck) and fluid is jetted to the specimen surface for surface treatment while the specimen is rotated mechanically.

Available as a method for avoiding the above-mentioned disadvantage is a specimen noncontact holding method using the Bernoulli effect of fluid, which will be hereinafter referred to as Bernoulli holding or Bernoulli chuck, as described in Japanese Patent Publication No. Sho 53-29550, which will be hereinafter called the second conventional example.

FIG. 1A is a sectional view of the main part showing a typical structure of Bernoulli holding. In the second conventional example, a specimen 10 having a plane and a flat plate (holder) 20 having a fluid supply hole 30 made on a surface are opposed to each other in parallel and the specimen 10 is noncontact-held by using negative pressure p between the specimen 10 and the holder 20 occurring when fluid 100 is supplied from the fluid supply hole 30, namely, the known Bernoulli effect. F in the figure denotes a fluid jet force that the specimen 10 receives when the fluid is jetted.

The principle of negative pressure p occurring between the specimen 10 and the holder 20 is known by the Bernoulli's theorem and therefore will not be discussed in detail here. Assuming that the negative pressure p is an attractive force, the fluid jet force becomes a repulsive force. The specimen 10 is noncontact-held by the holder 20 at a position where the attractive force and repulsive force and gravity caused by the specimen weight are balanced.

The Bernoulli holding is true as in FIG. 1A if the positional relationship between the specimen 10 and the holder 20 is inverted with respect to a top as shown in FIG. 1B.

The Bernoulli holding, which is noncontact holding, enables low contaminated specimen holding. The holding method also enables miniaturization of the system because a large-scaled drive and a power transmission path need not be used.

However, in the conventional method as described above, a force for inhibiting a lateral position shift of a specimen does not act, so that a position shift is prone to occur, To solve the problem, a method of mechanically bringing a stopper into contact with a specimen or a method of detecting a position shift and correcting it can be used. However, the former method does not provide complete noncontact holding because the position shift prevention means, etc., comes in partial contact with the specimen. The position shift prevention means in the latter method leads to a complicated system; it is hard to miniaturize.

Available as another noncontact holding method is a method of providing a fluid jet substrate on both or either of the top and bottom between which a wafer as a specimen is sandwiched and rotating the wafer with it picked up for treatment, which will be hereinafter referred to as the third conventional example, as described in Japanese Patent Laid-Open No. Sho 60-74438 and Japanese Patent Publication No. Hei 4-69420.

In the related arts, a force for inhibiting vertical and lateral position shifts of the wafer does not act. Further, the wafer has a chipped part called orientation flat and is asymmetric with respect to an axis. Thus, the fluid jet amount needs to be accurately controlled to enable packing up and rotation of the wafer.

That is, means for sensing the wafer position and control means for determining the point, direction, and amount of jetting fluid are required as described in Japanese Patent Laid-Open No. Hei 5-211225. This results in a large-scaled, complicated, and high-cost system, which is contrary to the present demands as described above.

Since gas can also be handled as incompressible fluid like liquid in an area in which the gas flow velocity is about a half of acoustic velocity (173 m/s) or less, it is well known from the fluid mechanics field that similar discussion can be applied in the related arts regardless of whether fluid is gas or liquid.

However, the art described in the first conventional example provides the holding method in which the holder comes in direct contact with a specimen, and contamination of the contact part of the specimen cannot be avoided. Since the specimen is held, washed, and dried by separate mechanisms, the system volume becomes large.

The art described in the second conventional example, which provides the holding method via fluid, is more excellent in the system volume and cleanness than the first conventional example, but a projection located on the outer surface of a holding plate to stabilize the holding position comes in contact with a specimen. Therefore, the contamination problem of the contact part of the specimen remains unsolved.

The art described in the third conventional example picks up and rotates a specimen by jetting wash liquid; it does not have means for ensuring that the specimen holding position is stable. Thus, the specimen is placed out of position due to an uneven jet caused by vibration, ripple, uneven rotation, pressure change, involved bubbles, etc., of a pump jetting wash liquid. In a remarkable case, the specimen collides with the side wall connecting the upper and lower jet parts or the upper or lower jet part. The specimen may be broken by the collision, broken pieces causing contamination. Particularly, a semiconductor wafer, which has a notch called orientation flat, is not a true circle and the rotation center and center of gravity differ. Thus, in picking up and rotation by the method, a position shift is prone to occur.

As described above, the related arts do not provide a system meeting the present demands, namely, a system which can stably hold a specimen in a noncontact condition, provide high cleanness by treatment, be small-sized and inexpensive because of few mechanical features, inhibit oxide film growth because of nonexposure to air, and perform high-speed treatment because of fast flow velocity of treatment fluid.

SUMMARY OF THE INTENTION

It is therefore a first object of the invention to provide a stable specimen holding method by Bernoulli holding. It is a second object of the invention to provide a fluid treatment method using the holding method to hold a specimen and to treat a face of the specimen with the fluid. It i a third object of the invention to provide a holding system of a plate-like specimen. It is a fourth object of the invention to provide a fluid treatment system of a plate-like specimen.

To the first end, according to the invention, there is provided a specimen holding method for noncontact-holding a specimen using the Bernoulli effect produced by causing fluid to flow between the specimen to be held and a specimen hold face opposed to the specimen, wherein the Bernoulli effect is used to noncontact-hold the specimen on the specimen hold face having a region surrounded by boundaries formed on the specimen hold face where the magnitude of tension acting between the outer peripheral surface of the held specimen and the specimen hold face rapidly changes, the region having almost the same size as the specimen in a direction where relative shift of the specimen to the specimen hold face should be suppressed.

More specifically, in the specimen holding method of holding the plate-like specimen 10 on the holder 20 via fluid in a noncontact condition, for example, as shown in FIGS. 1A and 1B, the size of the region of the specimen hold face 20a of the holder 20 facing the specimen 10 (Bernoulli effect producing region, hereinafter called Bernoulli effective region) is made the same as the specimen size within the range of −8 mm to +4 mm. For example a disc-like specimen such as the semiconductor substrate wafer, or rectangular or square shaped plate-like specimen may be used as the specimen 10.

According to the structure, a lateral position shift of the specimen 10 in the figure can be suppressed due to surface tension occurring on the end faces of the specimen 10 and the holder 20 when the fluid is liquid or due to static electricity between the holder 20 and the specimen 10 occurring due to slant flow or gas flow occurring on the end of the specimen 10 when the fluid is gas.

For example, as shown in FIG. 2A, in the method using two holders 20 to sandwich the specimen 10 therebetween for noncontact-holding it, the spacing between the specimen hold face 20a of the holder 20 and the surface of the specimen 10 is made 2.5 mm or less, whereby a repulsive force (F) and attractive force (p) can be caused to act on the specimen 10 from the Bernoulli effect for suppressing a vertical position shift of the specimen 10 in the figure.

The second object can be accomplished by using a fluid having a characteristic applying specific treatment on the hold face of the specimen in the specimen holding method accomplishing the first object.

In this case, a proper fluid is selected according to the specimen surface treatment purpose. As a typical application example, when the fluid is liquid, rinse treatment with pure water is a treatment example involving no chemical reaction. Etching treatment with an etching liquid and development process with a development liquid in various lithography steps are named as treatment examples involving chemical reaction. When the fluid is gas, drying treatment with an inert gas such as a nitrogen gas is named as a treatment example involving no chemical reaction and dry etching treatment with an etching gas is as a treatment example involving chemical reaction.

In such surface treatment, it is effective to give physical vibration to a specimen as means for enhancing the treatment effect. It can be provided by installing, for example, an ultrasonic vibrator as a vibration generation source on the surface or inside of the holder.

As another means for enhancing the treatment effect, it is effective to dispose on the surface of the holder a groove extending radially from the center of the holder, namely in a direction perpendicular to the rotation direction. Preferably, the groove has a structure equal in width extending like a continuous line from the center of the holder to its periphery or equal or different in width, for example, like a crescent extending like a curve, and a plurality of the grooves are disposed symmetrically (radially) with the rotation center as an axis. A fluid discharging hole may be made in the groove. According to the structure, for example, wash liquid and rinse liquid flows can be easily controlled.

The third object can be accomplished by using the holder having the structure capable of generating an inhibition force for inhibiting a position shift of a specimen described in the means for accomplishing the first object as specimen holding means of a specimen transfer or treatment system.

For example, the holder is connected to the arm tip of a robot and with a specimen held, the arm is moved for transferring the specimen. To mount the holder, a method of directing the hold face upward or downward is selected as required.

If the fluid is liquid, when a specimen is transferred, fluid supply can be stopped for transferring the specimen with it made still. This specimen holding uses the surface tension of the liquid. If the fluid is gas, it is desired to always jet gas.

The fourth object can be accomplished by using the holder having the structure capable of generating a force for inhibiting a position shift of a specimen as described in the means for accomplishing the third object as specimen holding means used in a specimen treatment system.

For example, the system may use one holder to treat only the hold face of a specimen and another means for treating the opposite face of the specimen or may use two holders to treat both faces of a specimen sandwiched therebetween.

A method is also effective wherein a plurality of fluid supply sources are disposed and a switch valve is provided to switch a path for supplying a desired fluid to a single holder forconsecutively executing a plurality of treatment steps. For example, this method can be applied to a process in which after a semiconductor wafer is treated with an etching liquid, the fluid is changed to pure water for rinsing and further the pure water is changed to a nitrogen gas for drying the wafer.

It is also effective to provide fluid temperature control means in the holder as means for furthermore miniaturizing the system.

According to the specimen holding method of the invention that can accomplish the first object, instability of the specimen position, a problem of the conventional Bernoulli holding and treatment methods, can be overcome. Therefore, stable noncontact holding of a plate-like specimen can be carried out by a holder of a simple structure. Further, a small and inexpensive system which can hold, transfer, and treat specimens can be provided by using the holder.

An inhibition force of a vertical position shift of a specimen acting on the specimen held by the holder of the invention will be discussed with reference to FIG. 2A by taking a specimen 10 sandwiched between two holders 20 to which the invention is applied as an example.

The specimen 10 stably floats at a place where five forces of the specimen weight (w) plus four forces Fu, Pu, Fl, and Pl in the figure are balanced. Since means for measuring the magnitude of each force individually is not available, the magnitude of each force and the specimen picking-up height was found by calculation from the fluid mechanics relational expression based on the known energy conservation law.

This calculation is an example in which a semiconductor substrate wafer was used as the specimen 10, wherein the holder was 125 mm in diameter, the fluid Jet hole was 1 mm in diameter, the jet hole was positioned in the center of the hold surface, the fluid was water, each of the upper and lower jet amounts was 5 liters/minute, and the specimen was 125 mm in diameter, 15.6 g in weight, and 0.55 mm in thickness. An example of the calculation results is as shown in FIG. 29.

According to the calculation results, when the spacing between the holders (gap except the wafer thickness) exceeds about 5 mm, suction forces Pu and Pl of the specimen 10 into the holders according to the Bernoulli's principle reach almost zero. This indicates that the specimen 10 floats or is picked up due to force balance of only the fluid jet forces Fu and Fl.

Normally, it is difficult to always maintain the fluid flow quantities Qu and Ql constant because of pump ripple, bubble occurrence, etc. Thus, if the spacing between the holders exceeds about 5 mm, the upper and lower force balance is thrown off and the specimen 10 starts vertical vibration and may come in contact with the upper or lower holder 20.

In addition, it is difficult to manufacture both the upper and lower holders which are the same in dimension specifications of the diameter, angle, hole internal face coarseness, etc., of each jet hole 30 for jetting fluid affecting the momentum of the fluid jetted to the specimen 10 through the jet holes 30. Thus, normally the upper and lower holders do not strictly match in the momentum of fluid jetted to the specimen 10 because of the differences in the dimension specifications of the jet holes 30 between the upper and lower holders. In such a condition, for example, if a specimen asymmetric with respect to an axis rotates, vertical vibration of the specimen becomes large all the more; in the worst case, the specimen 10 may come in contact with the holder 20.

Therefore, vertical vibration of a wafer can be prevented by the powerful Bernoulli suction effect produced when the spacing between the upper and lower holders except the thickness of the specimen 10 is made 5 mm (2.5 mm on either side) or less as in the invention.

Next, the effect of preventing a lateral position shift of a specimen 10 that can be carried out by the invention will be discussed.

First, an example in which the fluid is liquid will be given. FIG. 3A shows a state in which a wafer 10 floats or is picked up at the center position between upper and lower holders. Liquid drops from a part of the periphery of each holder, and the most part of the periphery of each holder forms a gas-liquid interface, which will be hereinafter referred to as meniscus S, due to the surface tension of the fluid between the holder and the wafer.

FIG. 3B shows a state in which the wafer 10 is placed out of position by some force in the right direction. In this state, meniscus S is formed as a form in which the surface area increases by the occurring position shift. Then, the surface tension, a force for minimizing the surface area of the meniscus S, acts and the state shown in FIG. 3B immediately attempts to restore to the stable state shown in FIG. 3A.

At the time, the inhibition force occurring corresponding to the surface tension and acting in a direction to restore the lateral shift of the specimen 10 varies depending on the relative relationship between the area of the wafer 10 and the area of the specimen hold face of the holder 20 facing the surface of the wafer 10, as shown in embodiments discussed below.

Particularly, a large inhibition force acts by making the area of the specimen 10 and the area of the specimen hold face of each holder 20 almost the same. Thus, according to the structure of the invention, a lateral position shift of the specimen 10 can be prevented more effectively.

Next, an example in which the fluid is gas will be given. In this example, it is considered that the following two inhibition forces act as inhibition forces for preventing a lateral position shift of the specimen 10.

The first inhibition force is an electrostatic attractive force occurring due to charge at the specimen 10 and the holders 20. FIG. 4A shows a charge state of the specimen 10 and the holders 20, wherein "+" denotes a positive charge, "−" denotes a negative charge, and the dotted line denotes an electric line of force.

It is well known in the surface chemistry field that a charge phenomenon occurs on the solid surface where a solid and fluid come in contact with each other regardless of metal or organic or inorganic material. Such a phenomenon occurrence mechanism is complicated and not yet completely clarified. However, it is clear that the phenomenon occurs due to contact of different kinds of materials; it is called frictional electrification, contact electrification, spray electrification, flow electrification, or the like according to the form.

For example, if the specimen 10 in the charge state and the electric lines of force in FIG. 4A is placed out of position as shown in FIG. 4B, the electric line of force between the specimen 10 and the holder 20 distorts and the state in FIG. 4B immediately attempts to restore to the stable state in FIG. 4A by the electrostatic attractive force (Coulomb force). If the area of the specimen 10 differs greatly from the area of the specimen hold face of the holder 20, the inhibition force caused by the electrostatic attractive force acting in a direction to restore the lateral shift lessens, as shown in embodiments discussed below.

If the holder 20 is made of electric insulating material, the inhibition force caused by the Coulomb force easily acts. It is considered that since charges are hard to move on the specimen hold face of the holder 20 made of electric insulating material, distortion of electric line of force occurring when the specimen 10 laterally shifts becomes large, Therefore, according to the Bernoulli's theorem the specimen 10 and the holders 20 are placed in parallel in a minute spacing and are made almost the same form, whereby a lateral position shift of the specimen 10 can be prevented by the first inhibition force caused by the charge effect of gas flowing as fluid.

The second inhibition force acting when the fluid is gas is as follows:

To use the second inhibition force, inhibition holes $30s$, $30s'$ . . . for controlling a lateral position shift of a specimen 10 are made symmetrically with respect to an axis on the outer peripheral surface of a lower holder 20, as shown in FIG. 5A. Numeral 100 in the figure indicates a gas flow condition flowing around the specimen 10 when the specimen 10 is picked up. On the ends of the specimen 10 and the lower holder 20, a gas flow in a slant direction with respect to the specimen hold face of the lower holder 20 is generated by confluence of a lateral gas flow along the specimen hold face of the lower holder 20 and an upward gas flow from the inhibition holes $30s$, $30s'$ . . . .

If the specimen 10 laterally shifts for some reason, a state as shown in FIG. 5B is entered. In this state, the inhibition hole $30s$ on the right end as the observer faces the figure is opened because of the position shift of the specimen 10, but the inhibition hole $30s'$ on the left end is closed on the surface of the specimen 10. Thus, the slant gas flow concentrates on the end of the specimen 10 all the more. As a result, a force in the right lateral direction, namely, the second inhibition force acts on the specimen 10 and immediately the specimen 10 is restored to the state shown in FIG. 5A.

The specimen 10 and each holder 20 are made almost the same form and control inhibition holes $30s$, $30s'$ . . . are made on the outer peripheral surface of the specimen hold face of the lower holder 20, whereby the second inhibition force acts efficiently, so that a lateral position shift of a specimen can be prevented, as shown in embodiment discussed below.

As described above, the size of the specimen hold face of a holder 20 is set in response to a necessary inhibition force and the size of a specimen 10. The specimen is held by using the holder 20 comprising the specimen hold face of the setup size, thereby providing a specimen holding method for enabling stable noncontact holding of the specimen 10.

Particularly, a lateral position shift of the specimen 10 can be prevented more efficiently by making the area of the specimen 10 and the area of the specimen hold face of the holder 20 almost the same.

The fluid treatment method of the invention that can accomplish the second object enables highly clean consecutive treatment using several kinds of fluids.

Since the specimen and holders are almost the same in dimensions, upper and lower planes can be completely separated by the specimen. Thus, the surface and rear of the specimen can always be treated separately with fluid. The specimen is always noncontact-held in minute treatment space formed by the upper and lower holders and is cleanly treated without coming in contact with external contaminated substance by the treatment effect of jetted fluid.

Further, in the invention, fluid always flows from the inside to outside of the treatment space, so that removed contaminants are carried to the outside and a vertical move and back flow do not exist. Therefore, a recontamination phenomenon does not occur. Chemical and physical reactions between fluid and a specimen are more enhanced by furthermore accelerating the flow velocity of treatment liquid flowing in the minute treatment space; as a result, the treatment speed can be increased.

Further, the specimen is stably and noncontactly held and treated in the minute treatment space regardless of whether the fluid is liquid or gas. Thus, the continuous change process from liquid to gas in treatment, rinsing, drying, etc., can be performed rapidly without wasting treatment liquid.

The specimen holding system of the invention that can accomplish the third object can provide a miniaturized system which enables stable specimen holding without any mechanical contact.

The specimen treatment system of the invention that can accomplish the fourth object can provide a miniaturized system which enables highly clean specimen treatment, rinsing, drying, and specimen transfer without any mechanical contact.

DESCRIPTION OF THE PREFERRED EMBODIMENTS

Referring now to the accompanying drawings, there are shown preferred embodiments of the invention.

<Embodiment 1>

A first embodiment of the invention will be discussed. A holder comprising a specimen hold face of almost the same size as a specimen to be held with fluid as liquid will be discussed. An inhibition force inhibiting a lateral position shift acting on the specimen to be held with the holder of the embodiment will be described.

(1) Device structure

Figure 6A:
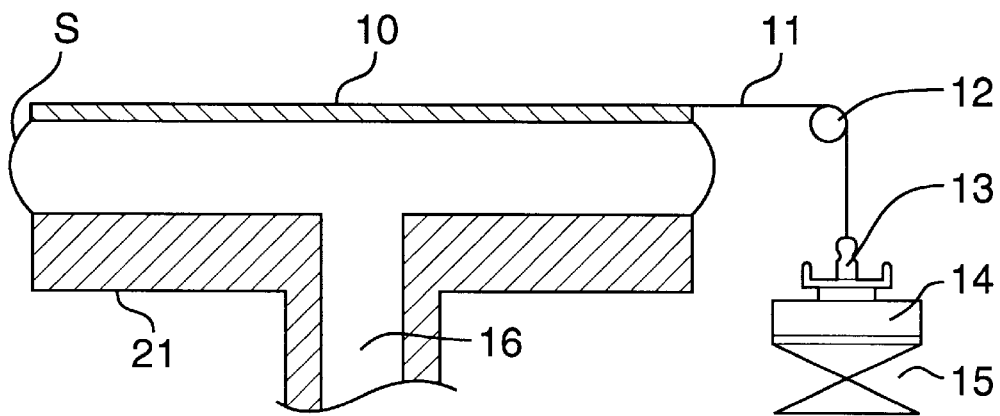
FIG. 6A is an illustration showing the structure of one embodiment of a holder of almost the same dimensions as a specimen to which the invention is applied and a measurement mechanism of an inhibition force acting on held specimen.

A holder 21 of the embodiment comprises a specimen lifting hole 16 (et hole) for picking up a specimen 10 1.0 mm in diameter, formed at the center of a fluoro resin plate like a disk 125 mm in diameter and 10 mm in thickness, for example, a polytetrafluoroethylene (Teflon) plate, as shown in FIG. 6A.

Figure 6B:
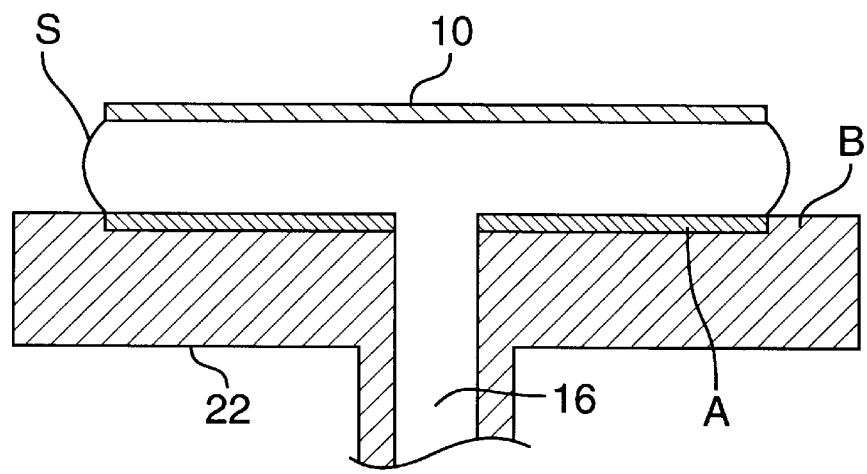
FIG. 6B is a sectional view showing one example of the structure of a holder having a Bernoulli effective region of almost the same dimensions as a specimen to which the invention is applied.

Another holder of the embodiment may take a structure as shown in FIG. 6B. That is, a holder 22 forms a Bernoulli effective region opposed to a wafer 10 by embedding alumina ceramic plate A of a purity 95% 125 mm diameter and 1.0 mm in thickness in the surface of the center of a disk-like Teflon plate B 205 mm in diameter and 10 mm in thickness. Further, a specimen lifting hole 16 1.0 mm in diameter is formed at the center of the Bernoulli effective region.

In the embodiment, a 5-inch silicon wafer (125 mm in diameter) was used as the specimen 10 and ultrapure water was jetted in a flow quantity of 2 liters/minute from the specimen lifting hole as fluid. At the time, the wafer 10 picked up 0.85 mm. The ultrapure water is supplied from a fluid tank contained in a fluid supply mechanism (not shown) by a fluid pump contained in the fluid supply mechanism.

The inhibition force acting on the specimen 10 held by the holder of the embodiment is measured, for example, as follows: A thread 11 is bonded to the end of the wafer 10 held with the holder 21 of the embodiment. It is connected via a pulley 12 to a weight 13 10 g in weight placed on an electronic balance 14. The electronic balance 14 is supported by a jack 15. In this condition, if the position of the jack 15 is lowered a predetermined distance, the wafer 10 shifts to the right. The inhibition force acting on the wafer 10 acts in the direction opposite to gravity of the weight 13. Therefore, the inhibition force is obtained by measuring a change in load to the electronic balance 14 due to the weight 13 on which the inhibition force acts.

(2) Operation

As described above, the inhibition force inhibiting a lateral position shift of the specimen 10 is caused by the surface tension of meniscus S formed between the specimen 10 and the holder 21 or 22.

Since the holder 21 of the embodiment comprises a specimen hold face of almost the same size and form as the specimen 10 to be held, the contact part between the specimen hold face and the meniscus S does not easily move even in deformation of the meniscus S associated with a lateral shift of the specimen 10. Therefore, if the specimen 10 laterally shifts, a force inhibiting the lateral position shift acts on the end of the specimen 10 because of the surface tension of the meniscus S deformed associated with the lateral shift.

The holder 22 of the embodiment has a specimen hold face (Bernoulli effective region) formed of material of almost the same form as the specimen 10, likely to wet with used liquid (showing extension wet) and further the outside of the specimen hold face is surrounded by material not wetting liquid (showing adhesive wet). According to the structure, as with the holder 21, a stable meniscus S is formed and a force inhibiting a lateral position shift due to the surface tension acts on the end of the specimen 10.

The surface tension of liquid used to produce the Bernoulli effect generally 30 dyn/cm or more or 21 dyn/cm containing wider applications. Thus, nylon, vinyl chloride, inorganic oxide, nitride, carbide, etc., having a critical surface tension (wetting liquid of a surface tension smaller than the critical surface tension) 21 dyn/cm or more can be used as material showing extension wet in the embodiment. On the other hand, fluoro resin (Teflon), polyethylene, polypropylene resin, etc., having a critical surface tension 21 dyn/cm or less can be used as material showing adhesive wet.

In the structure of the holder 22, Bernoulli effective region A is formed of material having a critical surface tension larger than the surface tension of used liquid and outer region B of the Bernoulli effective region A is formed of material having a critical surface tension smaller than the surface tension of liquid.

(3) Performance evaluation

Figure 6C:
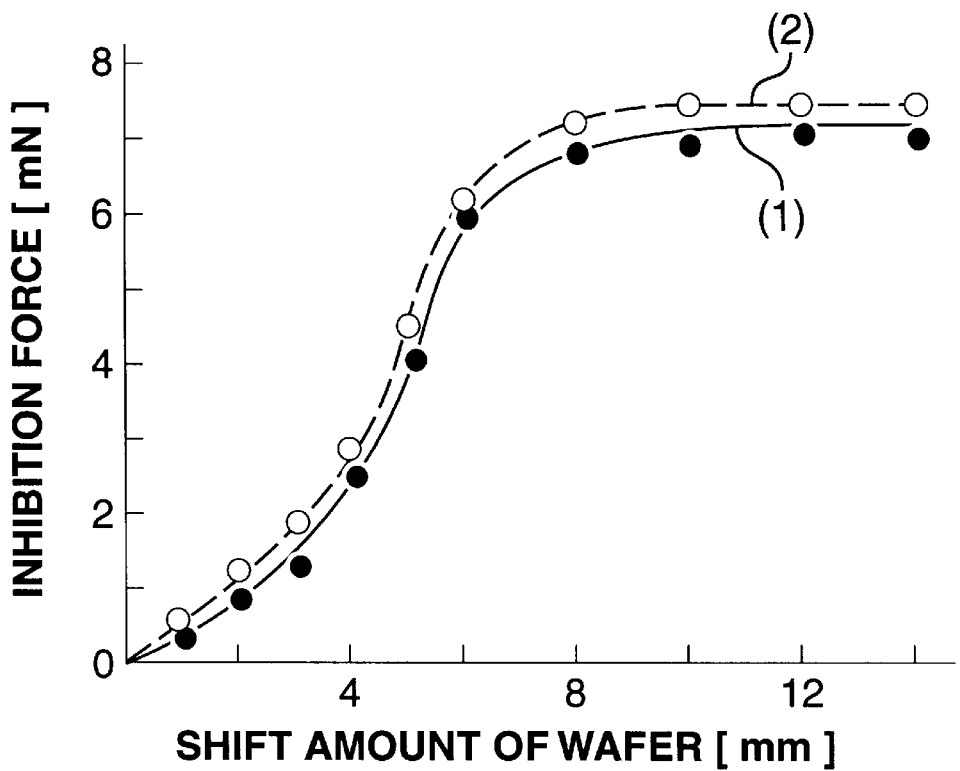
FIG. 6C is a graph showing the relationship between inhibition force acting on specimen held with the holder A, B in FIG. 6A, 6B and a shift amount.

When the holder 21 was used, the relationship between the shift amount of the wafer 10 and the inhibition force acting on the wafer 10 was measured as shown in curve (1) in FIG. 6C. In a small shift amount area, the inhibition force is also small because of the balance of the circumference of the wafer 10. However, when the shift amount exceeds 2 mm, the inhibition force rapidly increases, and when the shift amount is 6 mm or more, the inhibition force becomes almost constant 7 mN. When the shift amount exceeds 8 mm, the wafer comes in contact with the holder 21 and measurement is disabled.

When the holder 22 was used, the relationship between the shift amount of the wafer 10 and the inhibition force was measured as shown in curve (2) in FIG. 6C. Although the relationship between the shift amount of the wafer 10 and the inhibition force showed a similar trend to that with the holder 21, a larger inhibition force than that with holder 21 was obtained as a whole. It is assumed that a large inhibition force acts because the specimen hold face of the holder 22 positioned below the wafer 10 shows extension wet.

Figure 6D:
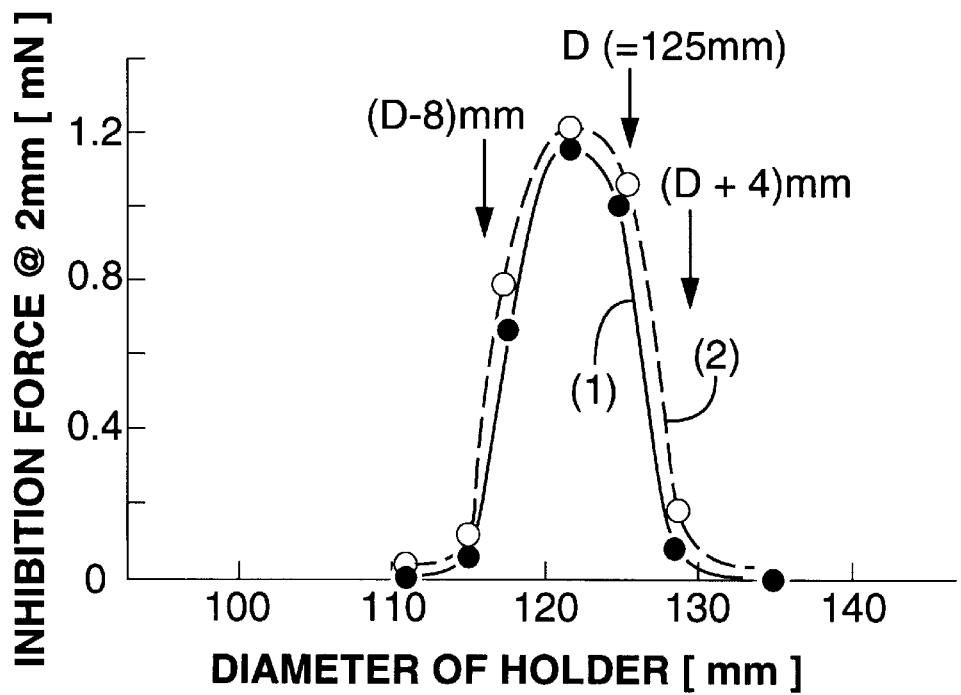
FIG. 6D is a graph showing the relationship between the holder diameter of specimen held with the holder A, B in FIG. 6A, 6B and inhibition force acting when the specimen shifts 2 mm from the center.

Curve (1) in FIG. 6D shows the relationship between the diameter of the holder 21 and the inhibit-on force when the 5-inch wafer is shifted 2 mm laterally from the center of the holder 21. The vertical axis of FIG. 6D shows an inhibition force when the wafer 10 shifts 2 mm laterally from the surface center of the holder 21 or 22. When the diameter of the holder 21 is 4 mm smaller than the wafer diameter D, the maximum inhibition force was measured. When the diameter of the holder 21 is in the range of (D+4) mm to (D−8) mm with respect to the diameter D of the wafer 10, a large inhibition force practically satisfactory.

Curve (2) in FIG. 6D shows the relationship between the diameter of the holder 22 and the inhibition force when the 5-inch water is shifted 2 mm laterally from the center of the holder 22. In this case, the Bernoulli effective region A is made of a silicon carbide substrate 125 mm in diameter and 1 mm in thickness. With the holder 22, a similar relationship to that in curve (1) was also obtained.

It is assumed that the phenomenon in which the maximum inhibition force acts when the diameter of the wafer 21 or 22 is smaller about 4 mm than the wafer diameter D occurs because deformation of the form of the meniscus S caused by the weight of the ultrapure water itself jetted from the specimen lifting hole 16 is contained.

Therefore, according to the embodiment, the size of a region producing the Bernoulli effect (Bernoulli region) is determined in response to the size of the specimen to be held and a desired inhibition force and a holder is formed so as to comprise a specimen hold face corresponding to the Bernoulli region, thereby providing a specimen holding method and device enabling a specimen to be stably held noncontactly.

In the embodiment, one specimen lifting hole 16 for jetting fluid to the specimen 10 is made at the center of the specimen hold face of the holder 20, but if more than one fluid jetting hole is made, a similar effect can also be produced.

Although a semiconductor substrate wafer is used as the specimen 10 in the embodiment, almost a similar effect to that of the embodiment is also produced for specimens of other forms, weight, and components.

Figure 1A:
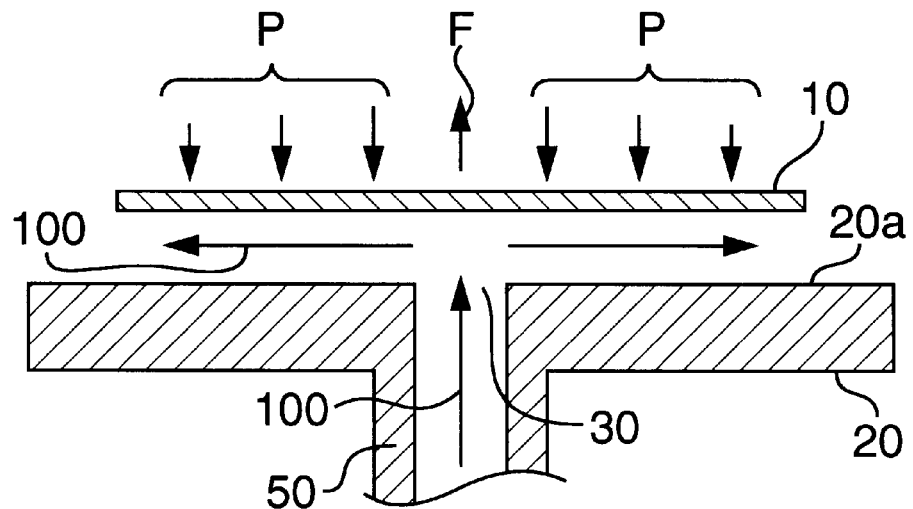
FIG. 1A is an illustration for explaining the Bernoulli holding principle.
Figure 1B:
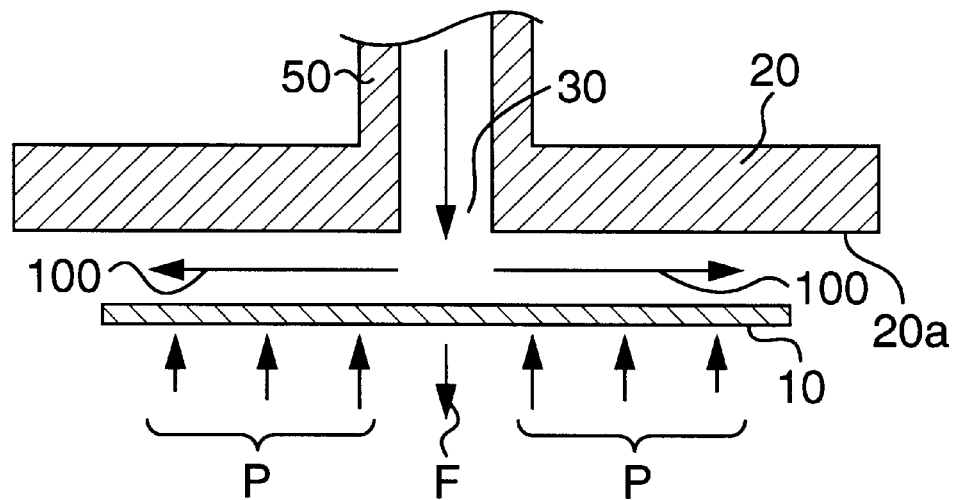
FIG. 1B is an illustration for explaining the Bernoulli holding principle.
Figure 2A:
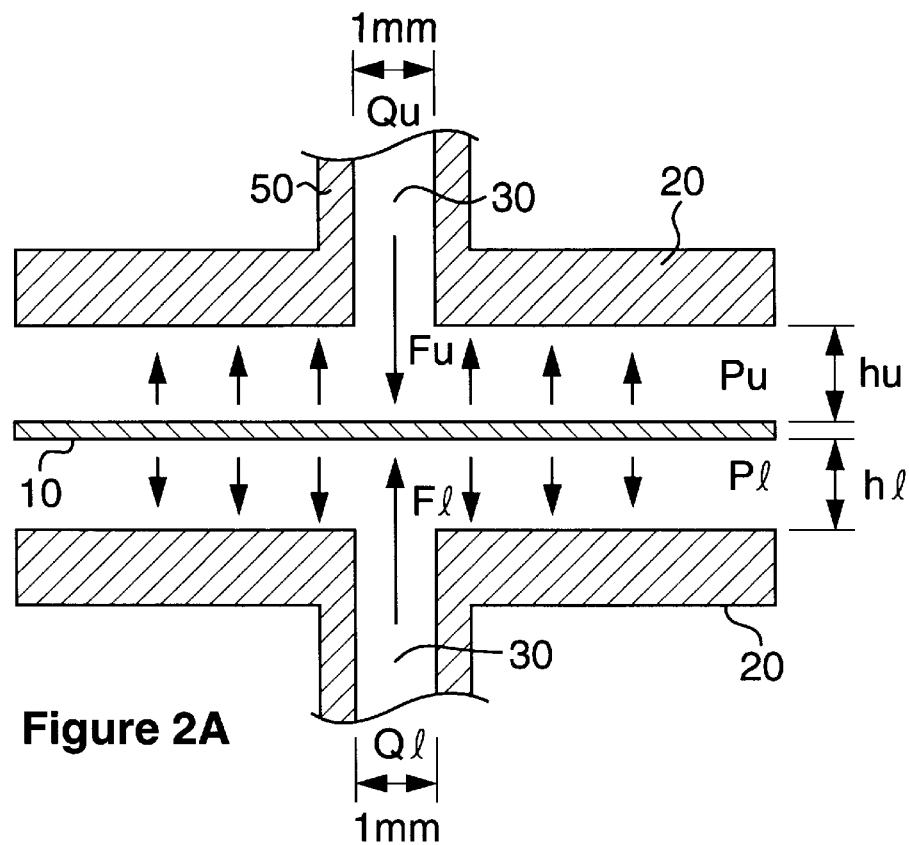
FIG. 2A is an illustration for explaining the relationships among forces acting on a specimen when upper and lower Bernoulli holders are used.
Figure 2B:
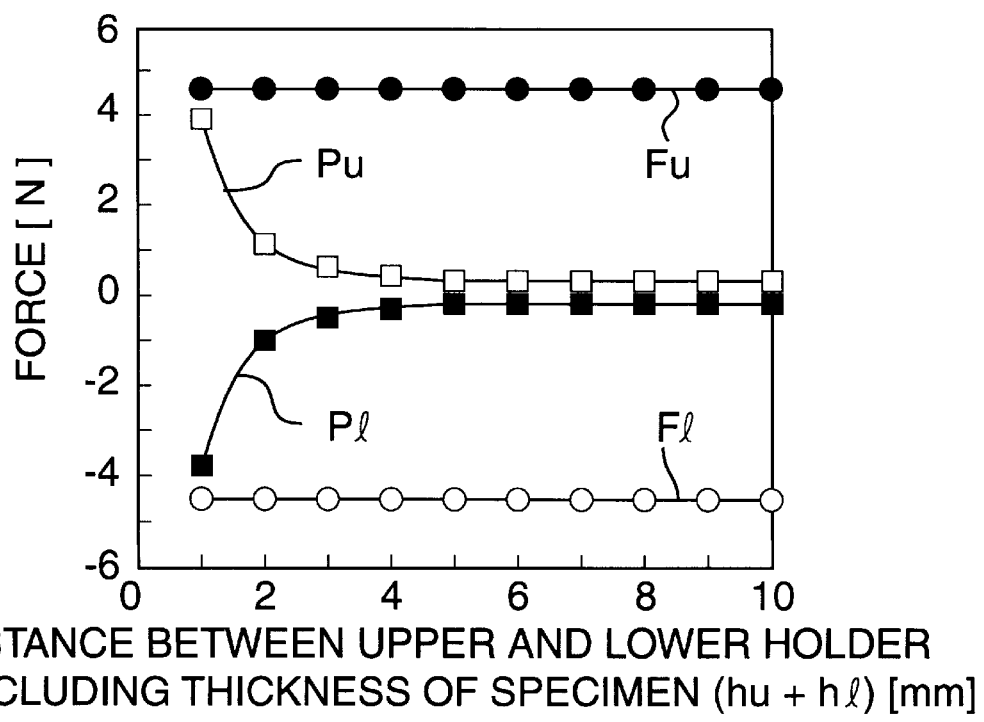
FIG. 2B is a graph showing the relationship between each force acting on a specimen and the spacing between upper and lower holders.
Figure 3A:
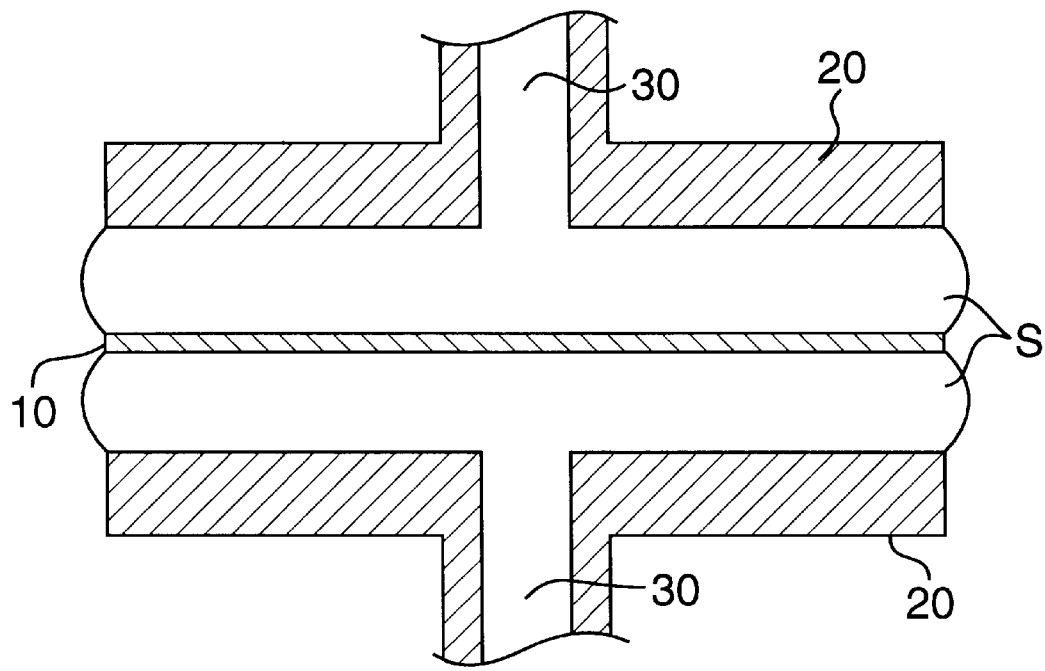
FIG. 3A is an illustration showing a meniscus when upper and lower holders are used.
Figure 3B:
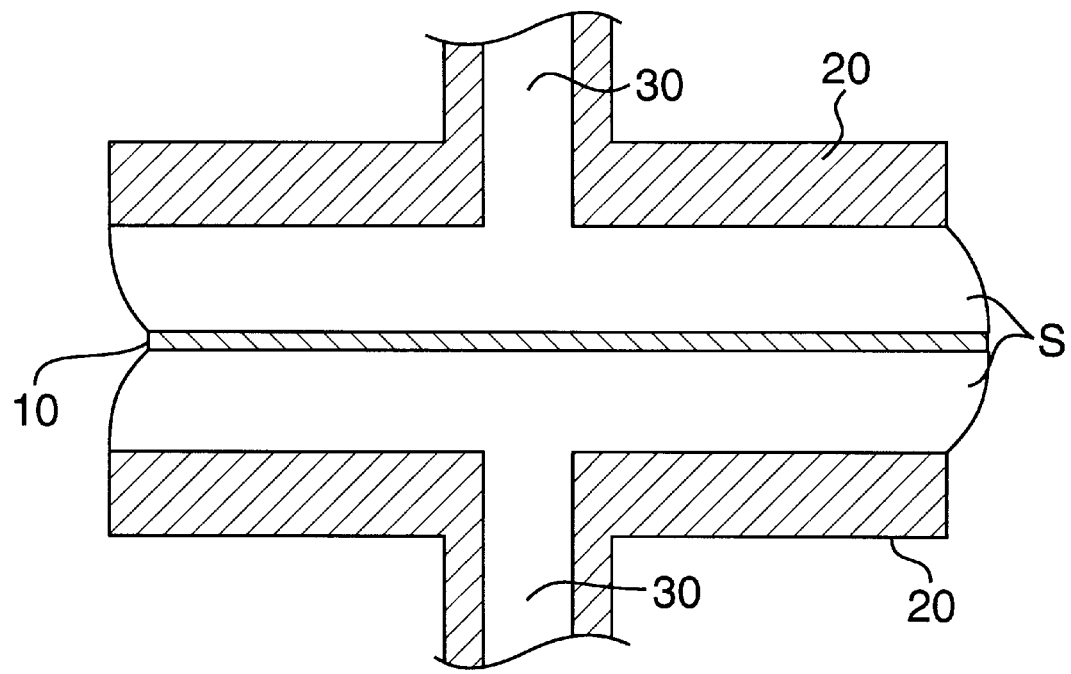
FIG. 3B is an illustration showing a meniscus shift occurring when the specimen shifts in a lateral direction in FIG. 3A.
Figure 4A:
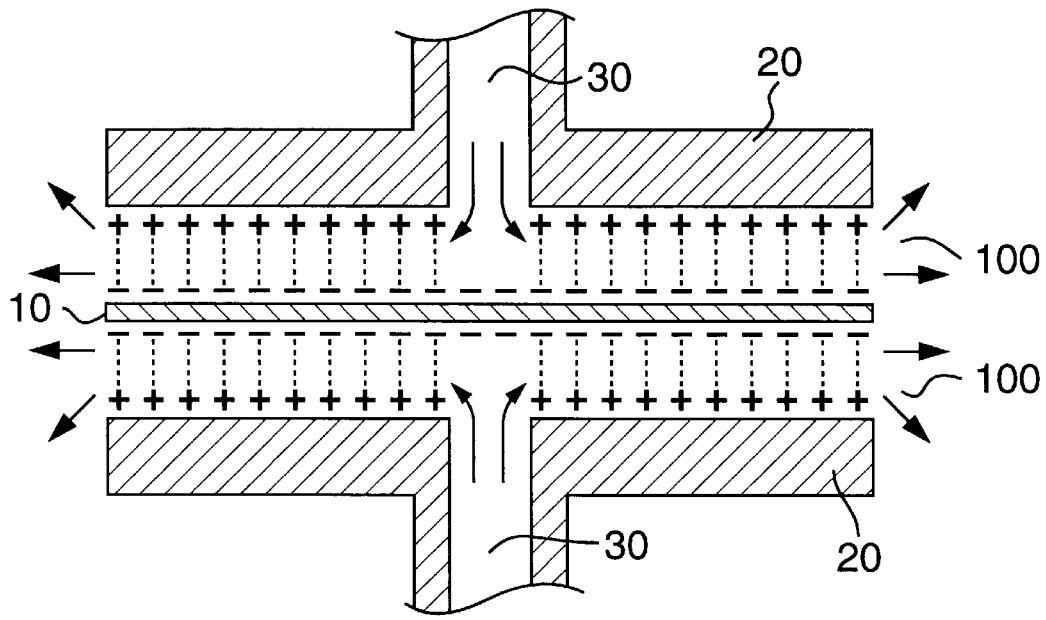
FIG. 4A is an illustration showing a charge state of a specimen held by upper and lower holders when gas is used.
Figure 4B:
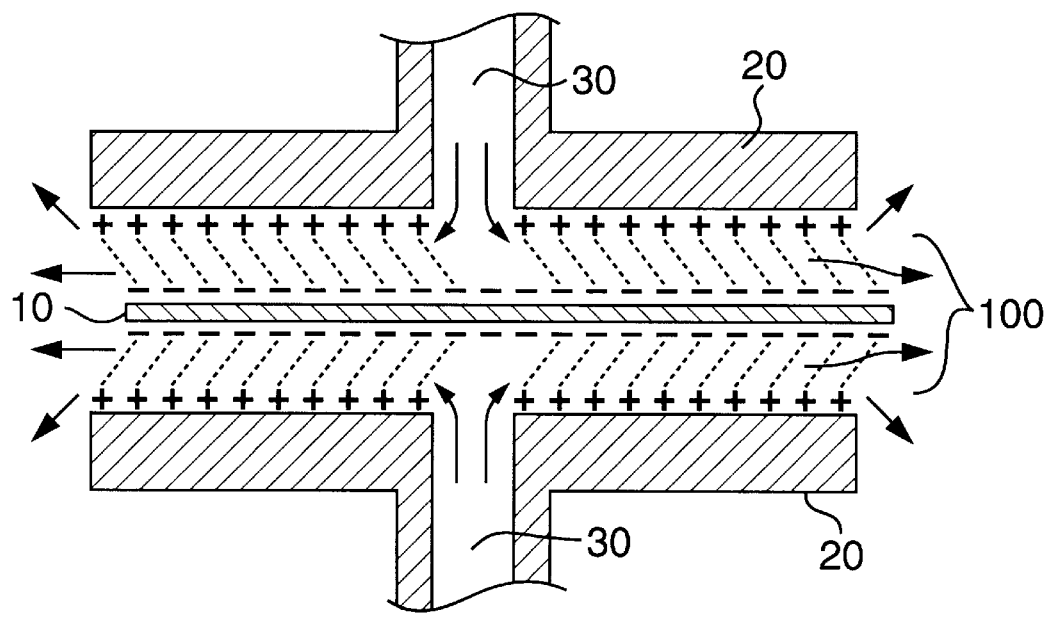
FIG. 4B is an illustration showing a charge state change occurring when the specimen shifts in a lateral direction in FIG. 4A.
Figure 5A:
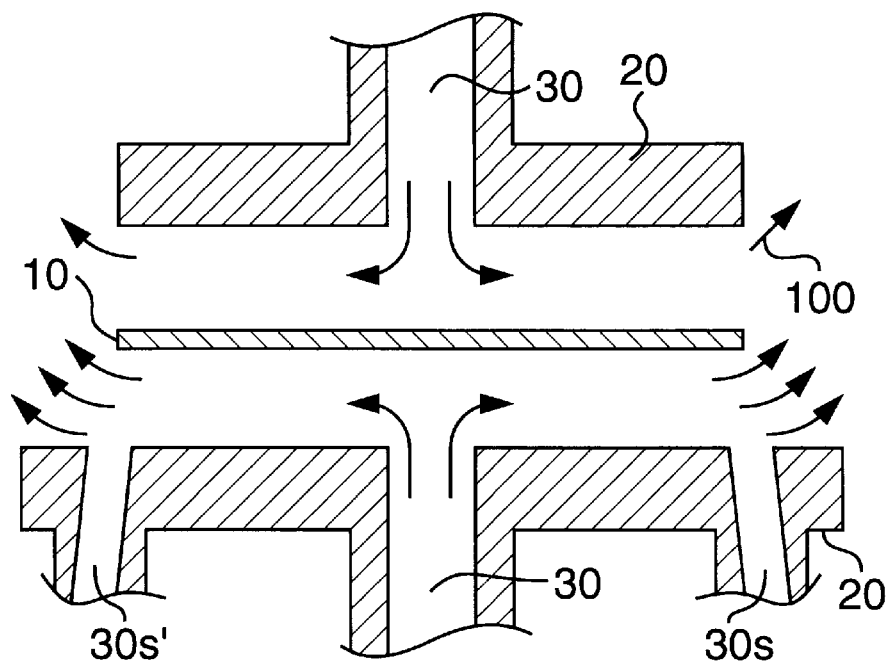
FIG. 5A is an illustration for explaining a force acting on a specimen when gas is jetted from inhibition holes.
Figure 5B:
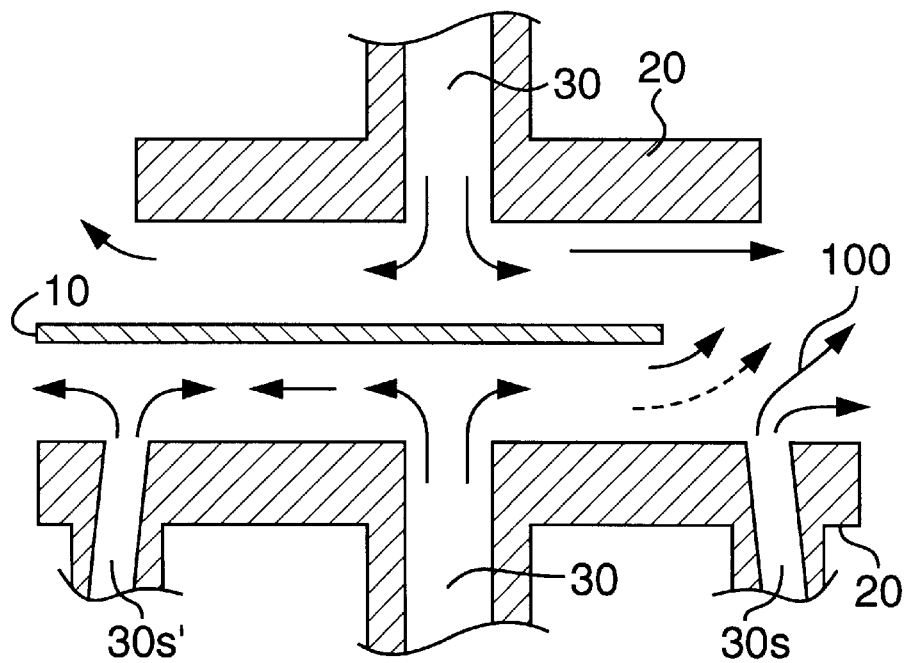
FIG. 5B is an illustration showing a gas flow change from the inhibition holes occurring when the specimen shifts in a lateral direction in FIG. 5A.

In the embodiment, the method of holding the specimen 10 with one holder 20 has been discussed. Of course, stable noncontact holding of the specimen 10 is also enabled if holders 20 placed above and below the specimen 10 so as to sandwich the specimen 10 are used, as shown in FIG. 3.

<Embodiment 2>

A second embodiment of the invention will be discussed.

As described above, the inhibition force acting on a specimen is produced by the surface tension of a meniscus formed on the specimen and holder end face. Thus, a larger inhibition force is provided by adjusting the outer surface form or end face form of the holder so as to obtain a larger surface tension change, namely, meniscus surface area change. The end face of the holder of the first embodiment is a plane making a right angle with the specimen hold face. In the second embodiment, a structure example of a holder having an outer surface or end face form providing a larger inhibition force will be discussed.

(1) Device structure

Figure 7A:
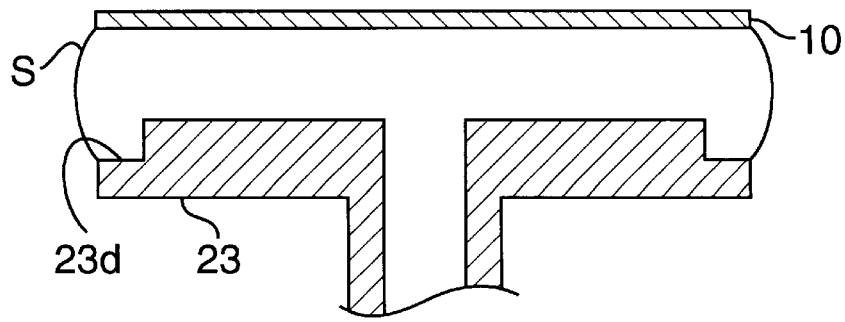
FIG. 7A is a sectional view showing one example (level difference) of the end face form of a holder to which the invention is applied.
Figure 7B:
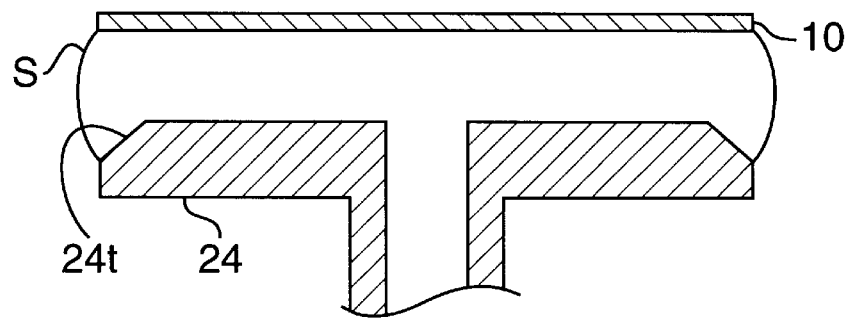
FIG. 7B is a sectional view showing another example (taper) of the end face form of a holder to which the invention is applied.

As shown in FIG. 7A, 7B, the structure of a holder 23, 24 of the embodiment is the same as that of the holder 21 of the first embodiment (see FIG. 6A) except the end face form.

In the second embodiment, the Teflon holder 23 has an outer surface formed with a level difference part 3 mm deep and 5 mm wide for increasing the surface area of meniscus S, as shown in FIG. 7A. The holder 24 has an outer surface formed with a taper part 24t forming a taper face at an angle of about 21.8 degrees with the specimen hold face of the holder 24 as dimensions of 2 mm in a depth direction and 5 mm in a lateral direction for increasing the surface area of meniscus S, as shown in FIG. 7B.

(2) Operation

Figure 7C:
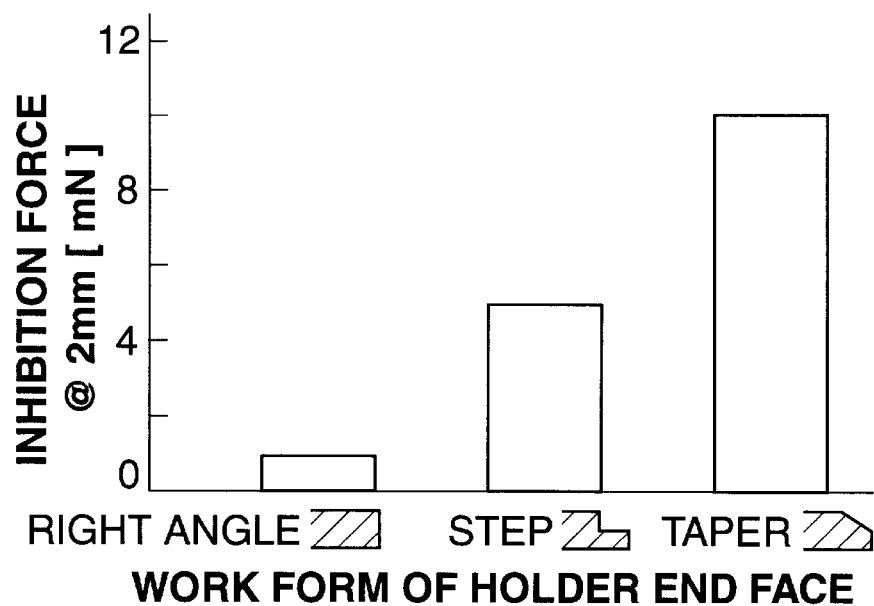
FIG. 7C is a graph showing the inhibition force magnitudes at the holders in FIGS. 7A and 7B.

FIG. 7C shows the results of measuring and comparing an inhibition force when a wafer 10 as a specimen is shifted 2 mm laterally from the center of the specimen hold face of the holder 23, 24 of the embodiment by the same method as in the first embodiment.

Both the holders 23 and 24 can provide a larger inhibition force as compared with the holder 21 shown in FIG. 6A. Particularly, the holder 24, which is formed with the taper part 24t on the outer surface of the holder, can provide a large inhibition force 8.8 mN, which is about 10 times the inhibition force provided by the right-angled simple form of the end face form of the holder 21.

According to the inhibition force experiment results in the embodiment, we found that if the surface area of the meniscus S is increased, the inhibition force increases. Considering the results and the measurement results concerning the inhibition force in the first embodiment together, it becomes more clear that when a specimen laterally shifts, an inhibition force acting so as to return the specimen to the central position of the specimen hold face of the holder depends on the surface tension of the meniscus S.

Further, according to the experiment results of the first and second embodiments, it becomes obvious that the inhibition force inhibiting a lateral shift of the specimen 10 can be increased by making the specimen and holder forms almost the same dimensions.

(3) Performance evaluation

According to the embodiment, the lateral inhibition force acting on the held specimen can be increased by forming the end face of the holder so as to increase the surface area of the meniscus S; a holder which is more stable for a lateral shift of a specimen and can hold the specimen noncontactly can be provided.

In the embodiment, a level difference or taper part is formed on the outer surface of the holder to increase the surface area of the meniscus when the fluid is a liquid; if the fluid is a gas, stability of the specimen 10 can also be enhanced by adjusting the outer surface part of the holder.

More specifically, the outer surface part of the holder is made an inverse taper structure, namely, a structure wherein the distance to the specimen 10 at the end face position of the specimen hold face of the holder is smaller than that at the center of the specimen hold face. According to such a structure, a gas flow in the outer surface part changes and an inhibition force acts in a direction to inhibit a position shift of the specimen 10.

<Embodiment 3>

A third embodiment of the invention will be discussed.

In the first and second embodiments, the relationship between the dimensions and end face form of the holder and inhibition force magnitudes has been discussed from the end face forms of the holders. In the third embodiment, examples of surface forms of specimen hold faces of holders for facilitating collection of liquid producing the Bernoulli effect will be discussed.

(1) Device structure

The holder described in the first, second embodiment is made of a material showing adhesive wet such as Teflon or polypropylene hard to wet with liquid or is provided by surrounding the Bernoulli effect region made of a material showing extension wet by a material showing adhesive wet.

With the holders of the structures, liquid jetted from the specimen lifting hole 16 does not flow out uniformly from the periphery of the holder and flows out branching from three to five points radially. Therefore, if points where liquid is liable to flow out are preset, flowing-out liquid can be collected.

Figure 8A:
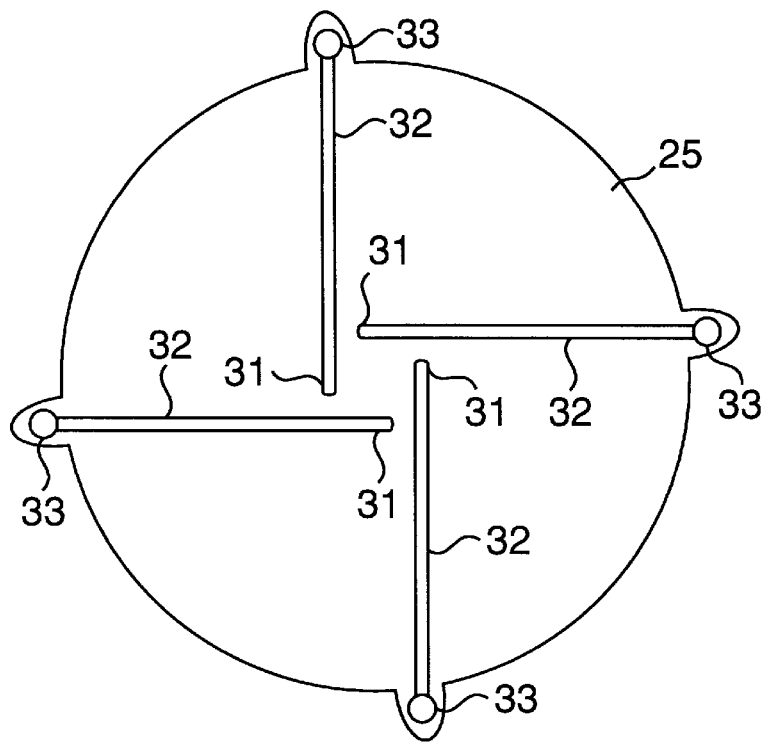
FIG. 8A is a sectional view showing one example of the specimen hold face form of a holder to which the invention is applied.

FIG. 8A shows an example of the surface form of a specimen hold face at a holder of the embodiment. The holder 25 of the embodiment has the same structure as the holder 21 of the first embodiment (see FIG. 6A) except for the following points:

Four specimen lifting holes 31 for jetting liquid are made on the specimen hold face of the holder 25 and a groove 32 0.3 mm deep and 2 mm wide is formed from each specimen lifting hole 31 to the outer surface. Further, a collection hole 33 for collecting liquid jetted from the specimen lifting hole 31 is located at the outer surface tip of each groove 32 on the specimen hold face of the holder 25. The liquid collected in the collection hole is stored, for example, in a collected liquid tank, etc., connected to the collection hole 33.

The grooves 32 formed on the specimen hold face of the holder 25 need not actually be grooves. For example, nylon, vinyl chloride, or the like showing extension wet easily wet with liquid may be put like tape. If the device can allow the liquid jetted from the specimen lifting hole 31 to easily flow, its specific structure is not limited.

Figure 8B:
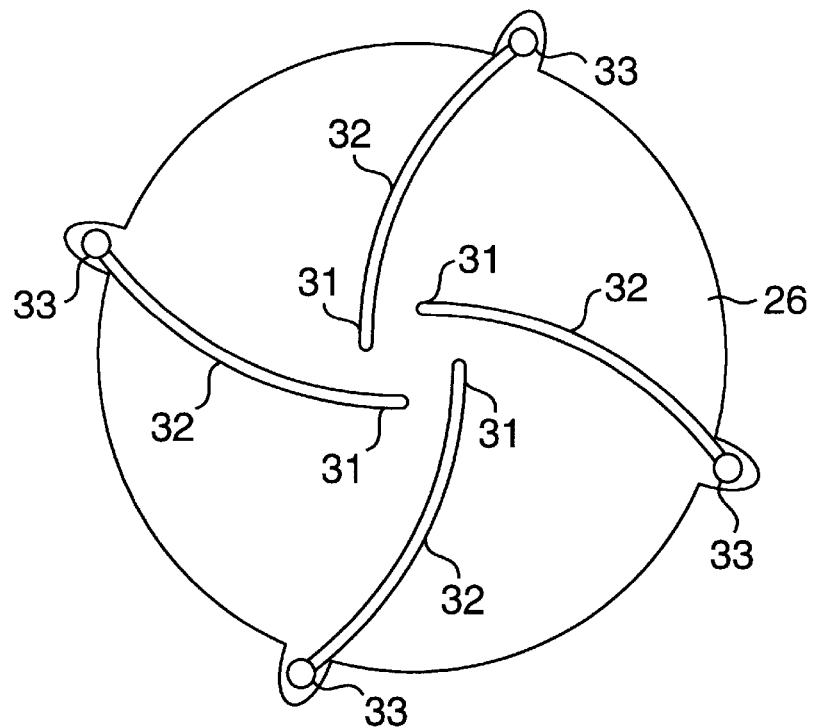
FIG. 8B is a sectional view showing another example of the specimen hold face form of a holder to which the invention is applied.

FIG. 8B shows another example of the surface form of a specimen hold face at a holder of the embodiment. The holder 26 of the embodiment enables noncontact holding for picking up a specimen while rotating it. The structure of the specimen 26 is the same as that of the specimen 25 except the form of specimen lifting hole 31 or the form of groove 32.

That is, the specimen lifting hole 31 is formed at a certain angle with the specimen hold face so that liquid can be jetted to the surface of a specimen along a predetermined angle direction. When liquid is jetted from the specimen lifting hole 31 of such a structure to the surface of the specimen 10, a rotation force in a direction to rotate with the normal direction of the specimen hold face as an axis is given to the specimen 10. As a result, the specimen 10 rotates on a plane parallel with the specimen hold face while the specimen is held noncontactly on the specimen hold face.

The grooves 32 on the specimen hold face of the holder 26 are formed spirally in the specimen rotation direction. According to such spiral grooves, liquid between the rotating specimen 10 and the specimen hold face can flow more rapidly without stagnating.

As with the holder 25, tape members made of material showing extension wet may be put spirally instead of providing the grooves 32. These may be along the flow line where the liquid jetted from the specimen lifting holes 32 flows on the specimen hold face of the holder 26.

(2) Operation

The liquid jetted from the specimen lifting holes 31 to a specimen at the holder 25, 26 of the embodiment flows into the collection holes 33 along the grooves 32 and are collected in the collection holes 33.

As in the second embodiment, inhibition force was found about a case where the peripheral end face form of the holder except the portions of the collection holes 33 is made at right angle (see FIG. 6A) and a case where taper parts (see FIG. 7B) are formed at the holders 25 and 26 of the embodiment.

Although the collection holes 33 are made, the inhibition force did not reduce at the holder 25, 26 of the embodiment. Both the holders 25 and 26 provided an inhibition force of about 1.0 mN when the end face form was at right angle and an inhibition force of about 9 mN when taper parts similar to those in FIG. 7B were formed.

(3) Performance evaluation

According to the embodiment, the liquid producing the Bernoulli effect can be collected more efficiently by putting grooves or tape members made of material showing extension wet on the specimen hold face of the holder.

<Embodiment 4>

A fourth embodiment of the invention will be discussed.

In the fourth embodiment, a holder comprising a specimen hold face of almost the same size as a specimen providing an inhibition force for inhibiting a lateral position shift of the specimen when fluid is gas will be described.

(1) Device structure

Figure 9A:
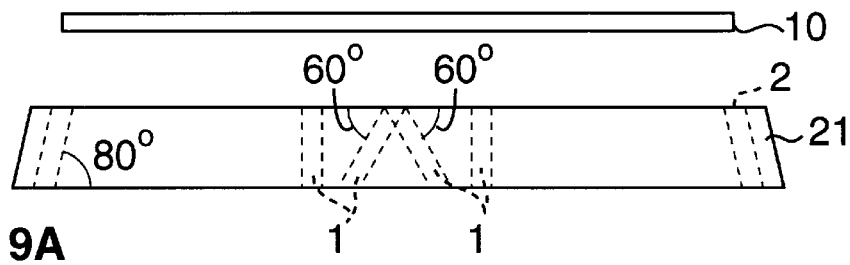
FIG. 9A is a sectional view showing a holder with inhibition holes to which the invention is applied and a specimen held by the holder.
Figure 9B:
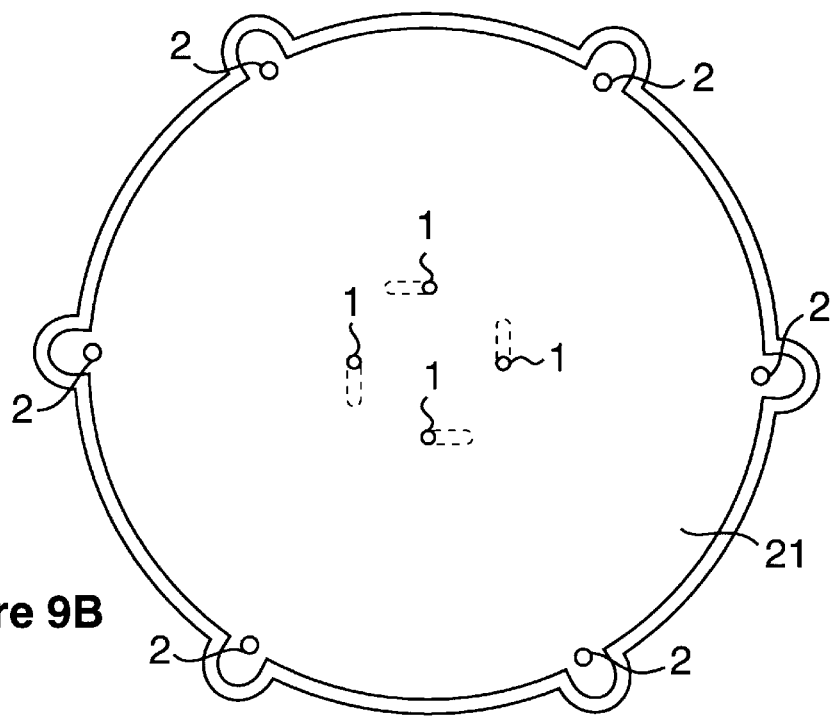
FIG. 9B is a top view of the holder in FIG. 9A.
Figure 9C:
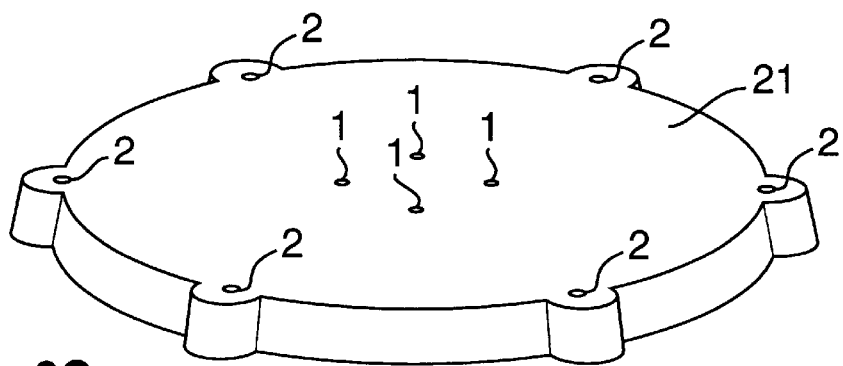
FIG. 9C is a perspective view of the holder in FIG. 9A.

FIG. 9A is a sectional view showing a holder 21 of the embodiment and a picked-up specimen 10 noncontact-held by the holder 21. FIG. 9B is a top view showing a condition of a specimen hold face of the holder 21. FIG. 9C is a perspective view of the holder 21.

The holder 21 of the embodiment is formed with four specimen lifting holes 1 for Jetting a gas for noncontact-holding the specimen 10 while rotating it and six inhibition holes 2 for generating a part of an inhibition force inhibiting a lateral position shift of the specimen 10. The holder 21 is made of an electric insulating member, more specifically, vinyl chloride, polytetrafluoroethylene (Teflon), or acrylic resin 10 mm thick. The specimen hold face of the holder 21 is a circle 125 mm in diameter.

Numbers, locations, angles to the specimen hold face, and hole sizes of the specimen lifting holes 1 and the inhibition holes 2 are not limited to the present embodiment. For example, the specimen lifting holes 1 are required only to give a rotational force to the held specimen 10 without inducing lateral shift. More specifically, a plurality of the specimen lifting holes 1 may be placed with conditions regarding the hole's dimensions that each force induced by the fluid jetted from the lifting hole 1 gives approximately the same moment to the rotational center of the specimen, and the vector summation of those forces give approximately 0 value.

The four specimen lifting holes 1 are through holes each 1 mm in diameter formed so as to be at an angle of 60 degrees with the specimen hold face so as to be symmetrical with respect to an axis. The inhibition holes 2 are placed on the outer peripheral surface of the holder 21. More specifically, each inhibition hole 2 is a through hole 1 mm in diameter so as to have a center on the outer surface line of the held specimen 10 and be at an angle of 80 degrees with the specimen hold face toward the center of the specimen hold face of the holder 21.

The specimen lifting holes 1 and the inhibition holes 2 are connected to a gas supply mechanism (not shown) containing a gas tank and a flow quantity adjustment device for supplying a gas to be jetted via predetermined pipes. The embodiment uses a 10-atmosphere nitrogen gas as the gas to be jetted. The nitrogen gas is supplied from a nitrogen tank via a flow quantity adjustment valve to the lifting holes 1 and the suppression holes 2 in a desired flow quantity.

The specimen 10 used in the embodiment is a 5-inch silicon wafer (125 mm in diameter) as in the first embodiment. The wafer is immersed in a solution of 99% water and 1% hydrofluoric acid at 25° C. for three minutes for etching. Further, it is immersed in ultrapure water for three minutes and rinsed and dried with a spin dryer for use as a wafer having a pure Si surface. A wafer having an $SiO_2$ surface formed by allowing that wafer to stand in the air day and night for natural oxidation of Si is also used as specimen 10.

(2) Operation

Electrostatic attraction acting between the holder 21 and the specimen 10, one source of an inhibition force acting so as to inhibit a lateral position shift of the held specimen 10 at the holder 21 of the embodiment will be discussed.

Figure 10A:
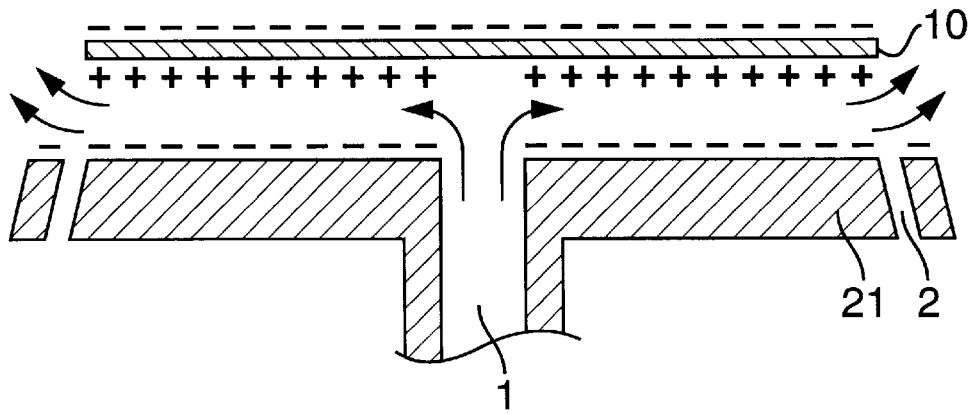
FIG. 10A is an illustration showing a charged condition of a specimen at the holder in FIG. 9A.

FIG. 10A shows an example of an electrostatic charge condition occurring between the holder 21 and the wafer 10 due to a fast air flow jetted from the specimen lifting holes 1. For clarity, the form of the specimen lifting hole 1 is omitted in FIG. 10A.

Figure 10B:
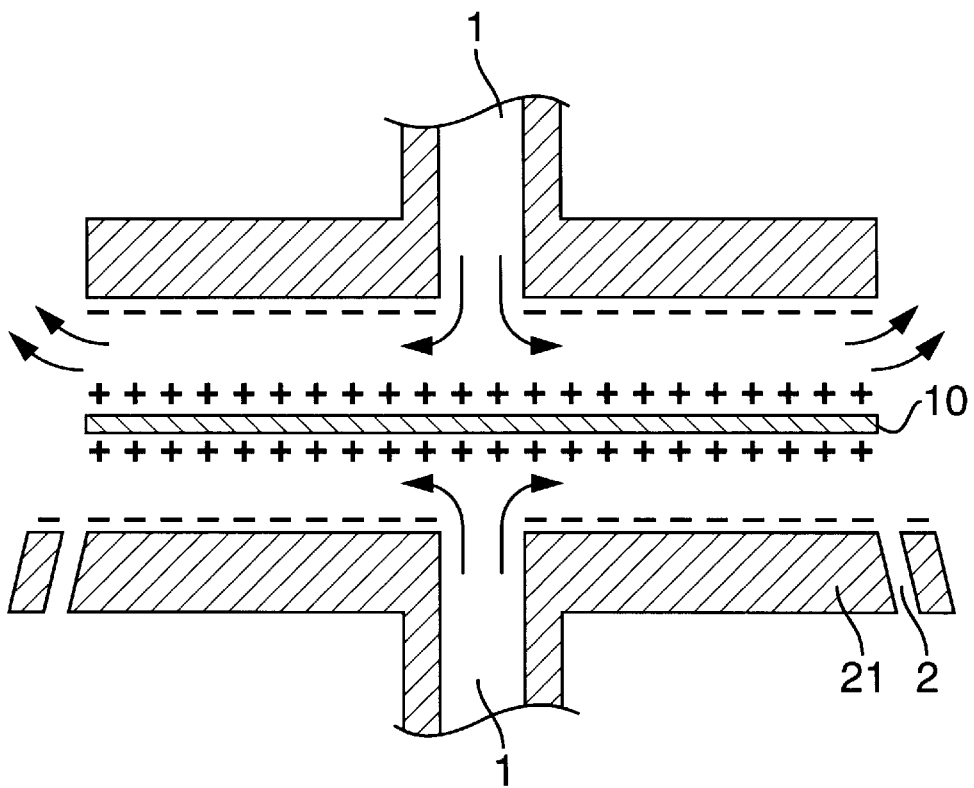
FIG. 10B is an illustration showing a charged condition of both faces of a specimen between upper and lower holders according to the invention.

If the holder 21 is, for example, negatively charged, the noncontact-held wafer 10 polarizes. Thus, it is considered that the wafer surface opposed to the specimen hold face of the holder 21 is positively charged and that the rear of the wafer is negatively charged. As shown in FIG. 10B, when a wafer is floating between upper and lower holders, both the surface and rear of the noncontact-held wafer are positively charged by induced electric charge.

Figure 11:
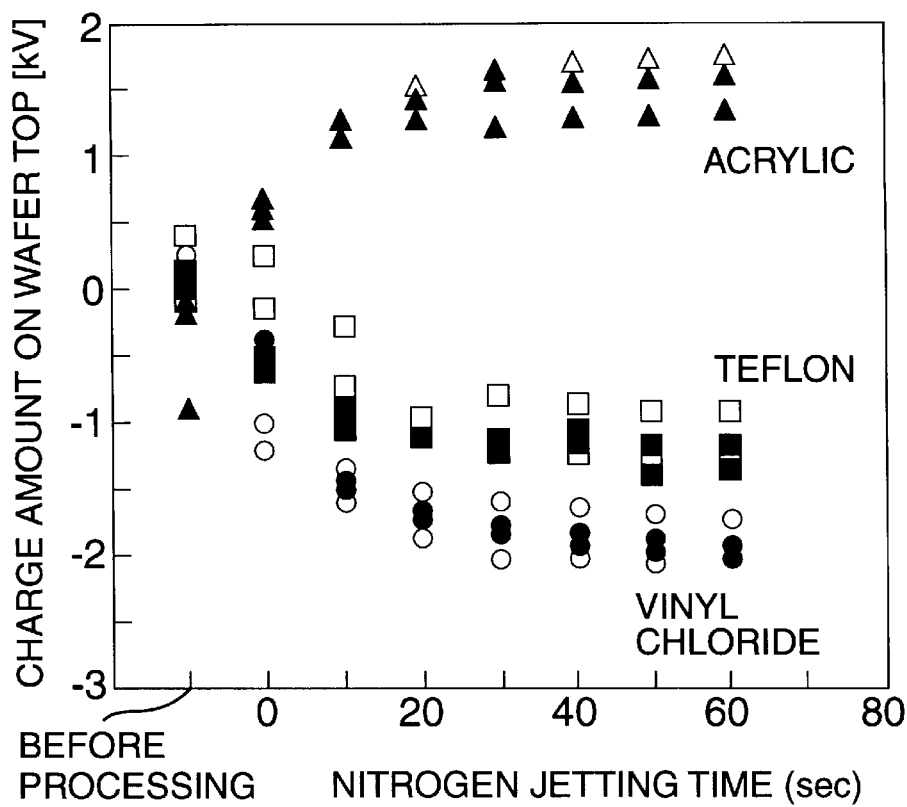
FIG. 11 is a graph showing time change of a charge condition of a specimen held with each of holders made of different materials according to the invention.

FIG. 11 shows the measurement results of charge amount on the charged wafer surface using Electrostatic Field Meter Model FM-300 manufactured by SIMCO in the U.K. at the holder 21 of the embodiment. FIG. 11 shows time change of wafer charge amount when nitrogen is jetted in a flow quantity of 20 liters/minutes from the specimen lifting holes 1 and in a flow quantity of 10 liters/minute from the inhibition holes 2 for picking up the wafer. The charge amount was measured on the top of the wafer 10, namely, on the rear of the face opposed to the specimen hold face of the holder 21.

At the holder 21 of the embodiment, as understood from the measurement results, the charge amount before picking up the wafer was almost zero, but as nitrogen was jetted, the wafer charge amount increased and became 1–2 KV after 40 seconds. It is also found that the electric charge of the wafer varies depending on the material of which the holder 21 is made. When the holder 21 was made of an acrylic resin, the charge was positive; when the holder 21 was made of Teflon or vinyl chloride resin, the charge was negative.

The measured charge amount, time change, and charge did not vary regardless of whether the wafer surface is Si or $SiO_2$.

The initial charge value of the holder 21 is 7.8 KV when the holder 21 is made of an acrylic resin; –0.8 KV when the holder 21 is made of Teflon; –8.2 KV when the holder 21 is made of a vinyl chloride resin.

Next, the magnitude of an inhibition force for inhibiting a lateral position shift of a held specimen at the holder of the embodiment will be discussed.

Figure 12A:
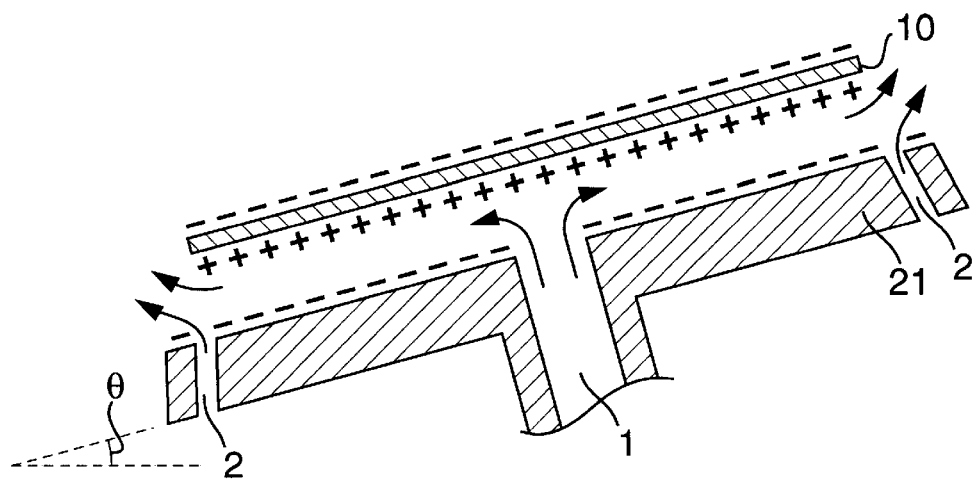
FIG. 12A is an illustration showing a measurement method of an inhibition force acting on a specimen at a holder when gas is used according to the invention.

In the embodiment, as shown in FIG. 12A, the holder 21 was tilted by angle and the nitrogen flow quantity relationship between the lifting holes 1 and the inhibition holes 2 required to prevent the wafer from laterally shifting in the condition was found. (See FIG. 12B.) The holder 21 is made of vinyl chloride.

Figure 12B:
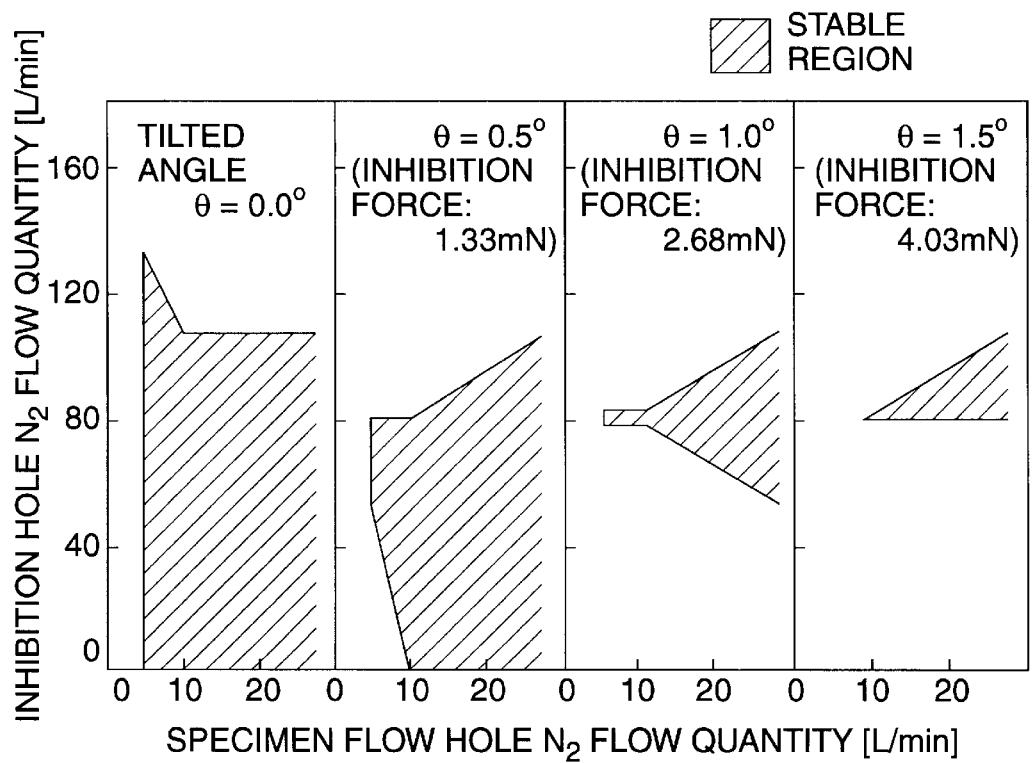
FIG. 12B is a graph showing the relationship of flow quantities jetted from inhibition hole and lifting hole when a specimen can be stably held by the holder in FIG. 12A.

In the structure of the holder 21 of the embodiment, the wafer 10 is rotated about 500–1500 revolutions/minute by the gas jetted from the specimen lifting holes 1. For this reason, the inhibition force cannot directly be measured. Thus, in the embodiment, the inhibition force is calculated as a lateral force generated due to weight (0.0156 kg) of the wafer when the holder 21 is tilted, namely, as 0.0156×g×Sin θ, where g is the acceleration of gravity and 9.8 m/s². The results are shown in FIG. 12B.

When the flow quantity of the inhibition hole 2 was zero, the wafer 10 was not placed out of position although it was tilted 0.5. From this fact, it is assumed that the inhibition force caused by static electricity has 1.33 mN. When nitrogen gas was jetted from the inhibition holes 2, the wafer 10 was not placed out of position although it was tilted 1.5. That is, the inhibition force caused by jetting nitrogen from the inhibition holes 2 has 2.7 mN and lateral position shift of the wafer 10 is inhibited by a large force of 4.03 mN (2.7 mN+1.33 mN (static electricity)).

The specimen lifting holes 1 and the inhibition holes 2 shown in FIGS. 9A, 9B, and 9C are the same in position and the specimen hold faces shown in the figures are the same in dimensions. Similar measurement to that in FIG. 12A was also made using a holder 200 mm in outer diameter larger than the wafer 125 mm in outer diameter. With the holder, the specimen was able to be noncontact-held by jetting nitrogen (lifting hole: 20 liters/minute, inhibition hole: 10 liters/minute), but an inhibition force for inhibiting a position shift did not act. Once the position of the specimen shifts, the specimen did not return to the former position.

Further, the wafer charge amount was measured as in FIG. 11 using a holder which is the same as the holder 21 shown in FIG. 9A, etc., in form and dimensions and is made of a material high in electric conductivity (in the example, aluminum). On a wafer noncontact-held with the aluminum holder, charge amount time change was not able to be measured and the initial charge amount value of the wafer was maintained. Similar measurement to that in FIG. 12A was also executed, but an inhibition force for inhibiting lateral position shift of the wafer was not able to be measured.

Insulating material having volume specific resistance $10^{14}$ cm or more can be used as members that can be used as material of the holders from the relationship between the material and inhibition force of the holder 20 as described above.

(3) Performance evaluation

According to the embodiment, a specimen can be stably noncontact-held by using a holder made of a member charged when gas is allowed to flow, comprising a specimen hold face of almost the same size as the specimen when the fluid is used as gas.

In the embodiment, the holders made of acrylic, Teflon, and vinyl chloride have been discussed, but holder materials are not limited to them. Generally, holder material needs only to be able to charge a certain amount or more when gas is allowed to flow along the surface; for example, electric insulating material can be used.

In the embodiment, the specimen hold face of the holder is charged by allowing gas to flow in order to produce the Bernoulli effect, and the specimen is charged by the electric effect. However, an electrode or the like may be placed on the specimen hold face of the holder for more aggressively charging the holder and specimen. According to the structure, more stable non-contact holding is enabled.

<Embodiment 5>

A fifth embodiment of the invention will be discussed.

The fifth embodiment provides an example of a fluid treatment system which noncontact-holds a specimen by means of liquid for producing the Bernoulli effect when the fluid is liquid, and executes specimen surface treatment by the liquid. The fluid processing system will be discussed in detail with reference to FIG. 13 showing the main configuration of the system and FIG. 14 showing the structure of a holder.

(1) Structure and configuration

Figure 13:
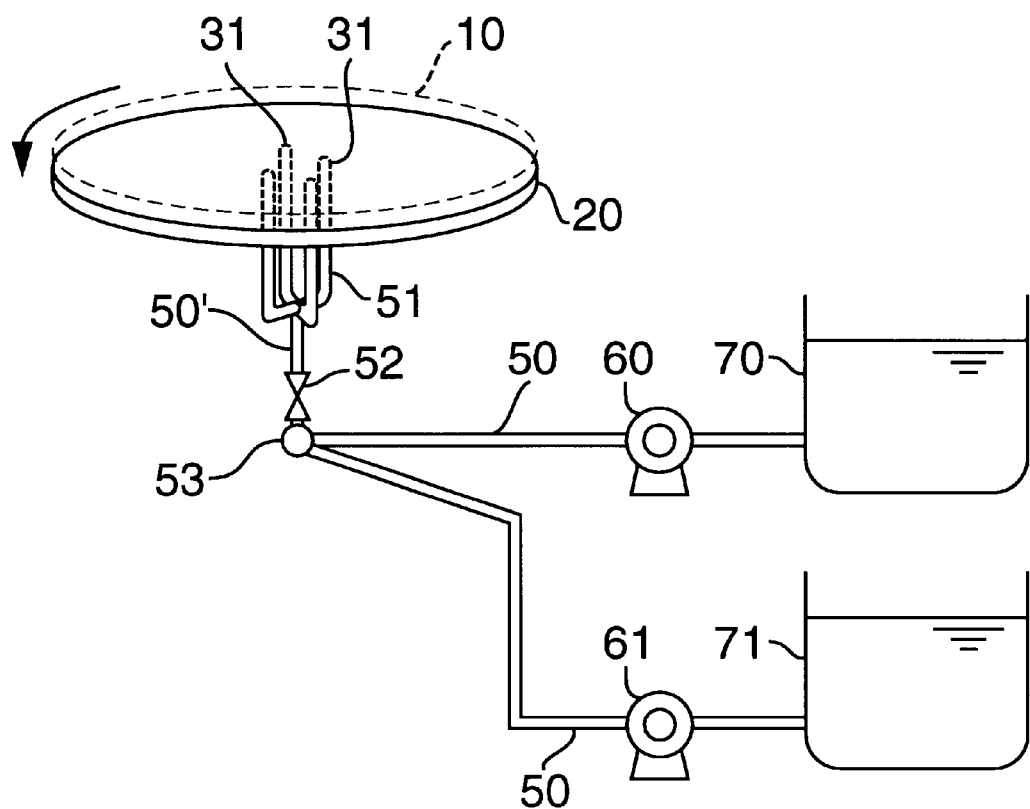
FIG. 13 is an illustration showing the main configuration of one embodiment of a holding and treatment system.

The fluid treatment system of the embodiment, which is appropriate for holding a semiconductor substrate wafer and its wash treatment, comprises a wash liquid tank 70 for storing fluid for producing the Bernoulli effect and executing surface treatment of a specimen 10, an ultrapure water tank 71, and a pipe line for connecting the tanks 70 and 71 and a holder 20 in addition to the holder 20 using the Bernoulli effect as described in the first to fourth embodiments, as shown in FIG. 13.

In addition to the basic components, the fluid treatment system of the embodiment further includes a treatment tank for including the specimen 10 and the holder 20, a dryer for drying the specimen, a collection device for discarding or collecting spent wash liquid, and a jig for transporting and passing the specimen 10. The description of the embodiment centers on the principles and therefore the components are not shown in the figure.

The holder 20 having a specimen hold face of almost the same form as the specimen 10 is used for reasons described in the above-discussed embodiments. A base portion making up the specimen hold face of the holder 20 is a polytetrafluoroethylene disk about 150 mm in diameter and four fluid supply holes 31 each 2 mm in diameter are formed at the center of the disk.

Figure 14A:
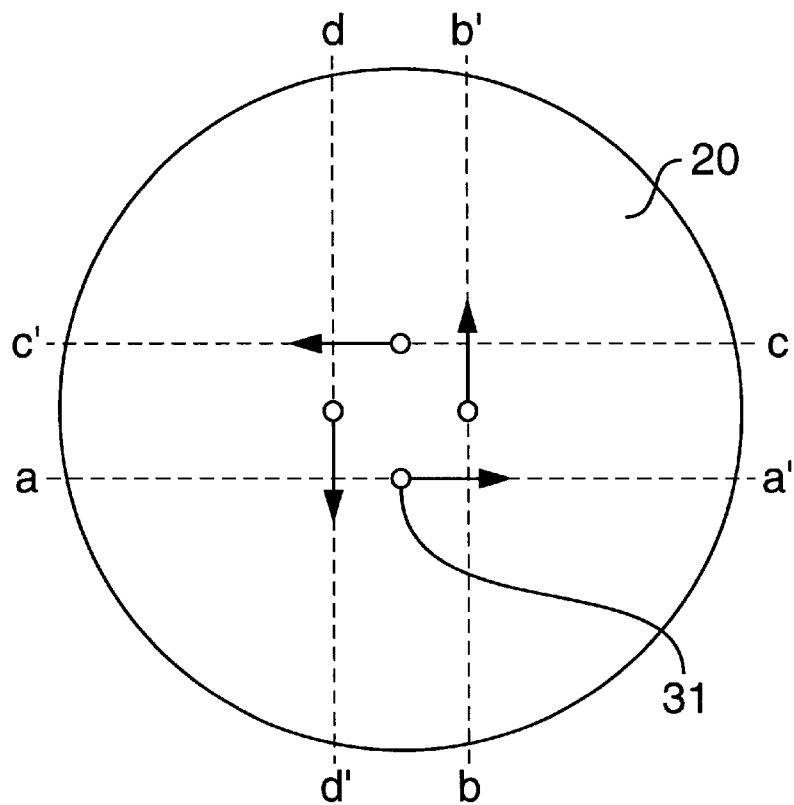
FIG. 14A is an illustration showing one example of the forms of specimen lifting holes (fluid supply holes) made in a holder according to the invention.
Figure 14B:
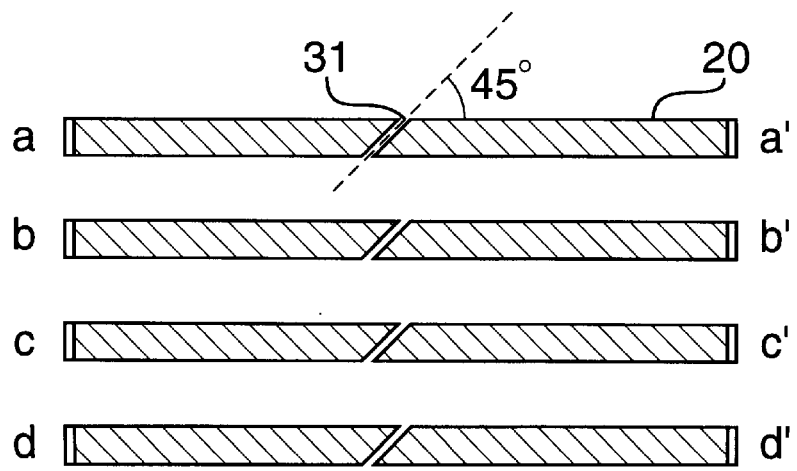
FIG. 14B is sectional views taken on lines a–a', b–b', c–c', and d–d' of FIG. 14A showing the angle which the specimen hold face forms with each specimen lifting hole at the holder in FIG. 14A.

Each fluid supply hole 31 is on a vertical angle of a square as shown in FIG. 14A and is made at a 45 tilt angle with the specimen hold face of the holder 20 so that jetted fluid has a speed component in the tangent direction for giving a rotation force to the specimen 10.

Each of the wash liquid tank 70 and the ultrapure tank 71 is a polytetrafluoroethylene square tank having a capacity of 30 liters and a pipe 50 is connected to the side near the bottom of the tank. The wash liquid tank 70 contains a heater (not shown) coated with a substance resistance to chemicals for setting chemicals to a predetermined liquid temperature.

The pipe line has fluid supply branch pipes 51 each connected to each of the four fluid supply holes 31, a fluid supply pipe 50' into which they are integrated, an opening/closing valve 52, a switch valve 53 capable of switching two pipe lines, a wash liquid tank pump 60, and an ultrapure water tank pump 61.

In the embodiment, the specimen hold face of the holder 20 is limited to that of almost the same form as the specimen 10, but the specimen hold face made of different materials inside and outside of the Bernoulli effective region may be used like the holder illustrated in the third embodiment (see FIG. 6B). The end face form may be the form as shown in FIG. 7A or 7B. As illustrated in FIGS. 8A and 8B, grooves, collection holes, etc., may be made on the specimen hold face of the holder for providing a mechanism for collecting the liquid jetted from the fluid supply holes 31 more efficiently.

Figure 15:
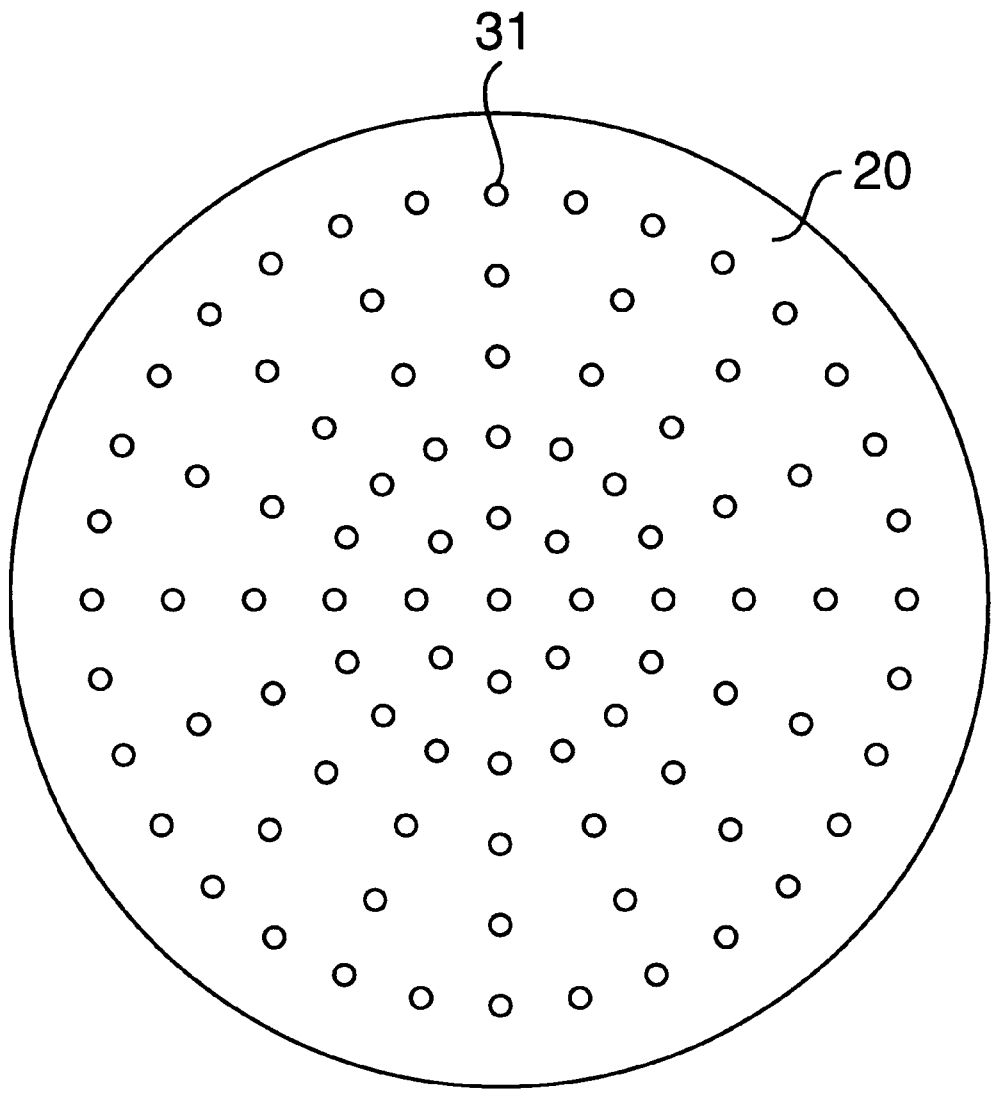
FIG. 15 is a top view showing an example in which a large number of specimen lifting holes are made in the holder according to the invention.

The number, positions, layout, and hole angle of the fluid supply holes 31 are not limited to those in the above-given example. For example, a large number of holes may be made on the specimen hold face of the holder 20 as shown in FIG. 15. The hole angle is not limited to 45 either; for example, it may be 30 to 90. Further, the positional relationship between the holder 20 and the specimen 10 may be inverted (upside down). Ultrapure water supply may be connected directly to the ultrapure water supply facilities without using the ultrapure water tank 61.

(2) Operation

As shown in FIG. 13, the holder 20 of the embodiment noncontact-holds a specimen indicated by a broken line (a 6-inch Si wafer 150 mm in diameter) in parallel at a position facing the specimen hold face of the holder 20 apart about 1–2 mm above the holder 20.

In the fluid treatment method of the embodiment, first the switch valve 53 is opened to the side of the wash liquid tank 70, then the valve 52 is opened for starting wash liquid supply. The specimen 10 is given rotation speed by a jetting force of wash liquid at 2 liters/minute from the fluid supply holes 31, and is noncontact-held while it rotates about 50 revolutions/minute in the arrow direction.

At the time, a gas-liquid interface is formed between the end faces of the specimen 10 and the holder 20. The specimen 10 is stably noncontact-held with the holder 20 by the gas-liquid interface, and the surface of the specimen 10 facing the specimen hold face of the holder 20, which will be hereinafter referred to as the hold face of the specimen, is washed by the liquid maintaining the gas-liquid interface.

Next, when the switch valve 53 is opened to the side of the ultrapure water tank 71 and ultrapure water supply (2 liters/minute) is started, ultrapure water is jetted from the fluid supply holes 31 for rinsing the hold face of the specimen 10. At the time, the specimen 10 is noncontact-held with the holder while it stably rotates as in the washing. In the embodiment, after the rinsed specimen 10 was dried by the spin drier, the following performance evaluation was executed.

(3) Performance evaluation

The fluid treatment system of the embodiment enables stable noncontact-holding of the specimen 10. Further, a change from wash liquid to rinse liquid in wash treatment can also be well made without causing the specimen 10 to come in contact with the holder 20 or to be placed out of place. This is because once the interface between the specimen 10 and the specimen hold face of the holder 20 is filled with liquid, even if liquid supply stops, not all filled liquid flows out due to the surface tension of the filled liquid unless an external force is given.

It was verified that the noncontact treatment capability according to the embodiment is more excellent than that of the conventional method from the result of washing the specimen 10 intentionally contaminated by fine particles and the result of washing the specimen intentionally contaminated by metallic ions. These treatments will be discussed in detail.

(3-1) To wash specimen intentionally contaminated by fine particles

Specimen 10 was prepared by immersing a 6-inch silicon wafer not subjected to surface treatment in an about 0.5% hydrofluoric acid aqueous solution containing silicon powders 0.2 m in particle diameter. About 9000 silicon powders adhered to the wafer surface by the treatment. The fine particles were measured by using a laser surface test system manufactured by Hitachi Device Engineering.

Wash liquid is an aqueous solution of ammonia water+ hydrogen peroxide water constituting about 0.5% by weight and about 2.5% by weight respectively at liquid temperature about 80.

Figure 16A:
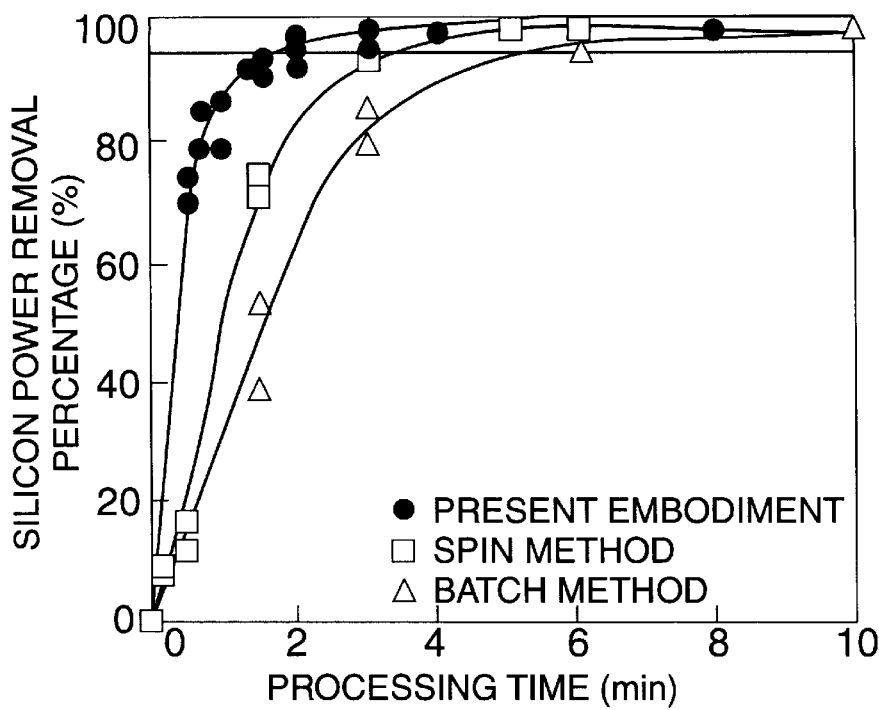
FIG. 16A is a graph showing the silicon powder removal percentage by the holding and treatment system in FIG. 13A.

FIG. 16A shows wash time dependency of the silicon power removal percentage when wash treatment is executed by the system of the embodiment. For comparison, the known spin wash and immersion wash results are also shown in the figure.

In washing according to the embodiment, wash liquid flows at high speed through a minute gap between the holder 20 and the specimen 10, because the flow-out speed of the wash liquid jetted from the fluid supply hole 31 is accelerated by the Bernoulli effect. Such treatment with wash liquid flowing at high speed enhances the physical and chemical wash effects and enables more efficient washing at higher washing speed as compared with the two known methods.

(3-2) To wash specimen intentionally contaminated by metallic ions

Specimen 10 is prepared by spin-coating a liquid containing predetermined concentration of iron, copper, nickel, and chromium on a 6-inch silicon wafer not subjected to surface treatment. The metallic ions about $10^{12}$ atoms/cm$^2$ adhere to the wafer surface by the treatment. The adherent metallic ions were measured by using a total reflection fluorescent X-ray analyzer manufactured by Technos Corporation.

Wash liquid is an aqueous solution of hydrochloric acid+ hydrogen peroxide water constituting about 4.6% by weight and about 0.3% by weight respectively at liquid temperature about 80.

Figure 16B:
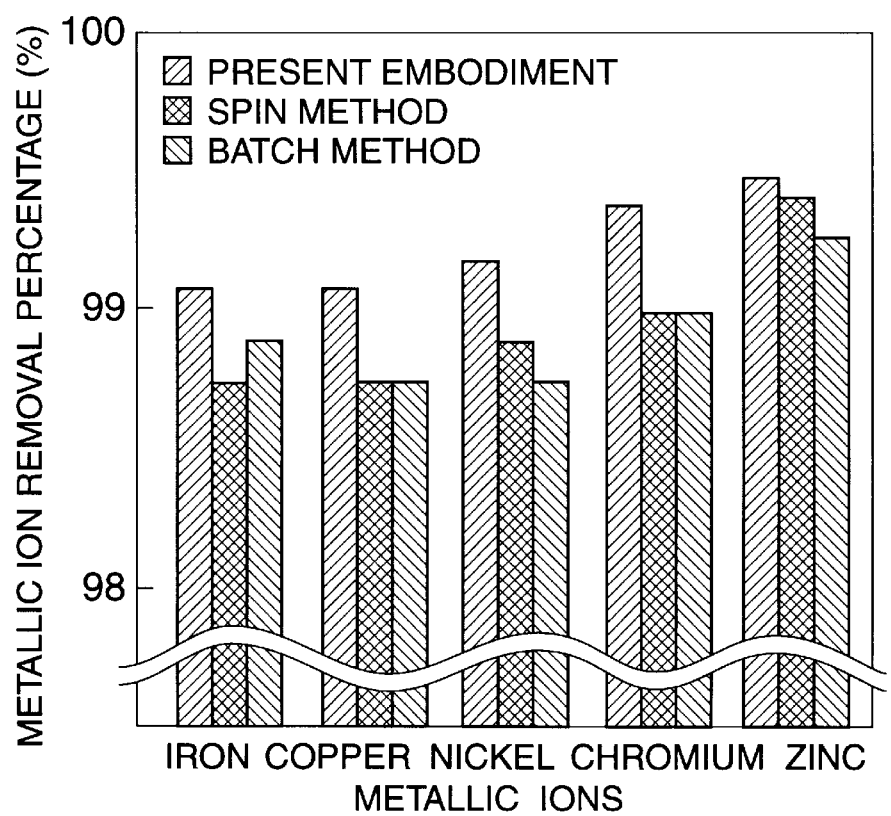
FIG. 16B is a graph showing the metallic ion removal percentage by the holding and treatment system in FIG. 13A.

FIG. 16B shows the amount of metallic ions adherent to the wafer 10 measured after wash treatment for three minutes by the system of the embodiment. For comparison, the measurement results about wafers washed by the known spin wash and immersion wash are also shown in the figure.

According to the wash treatment of the embodiment, only $5 \times 10^9$ atoms/cm$^2$ or less of the metallic ions adhere to the wafer after wash treatment, and removal percentage of 99% or more higher than the spin wash and immersion results can be accomplished.

According to the embodiment, when the fluid is a liquid, a fluid treatment method and system for noncontact-holding a specimen by the liquid for producing the Bernoulli effect and executing specimen surface treatment by the liquid can be provided.

<Embodiment 6>

A sixth embodiment of the invention will be discussed.

In the embodiment, a fluid treatment method and system which can perform washing and drying consecutively with a plurality of wash liquids will be discussed in detail with reference to FIG. 17.

(2) Configuration

Figure 17:
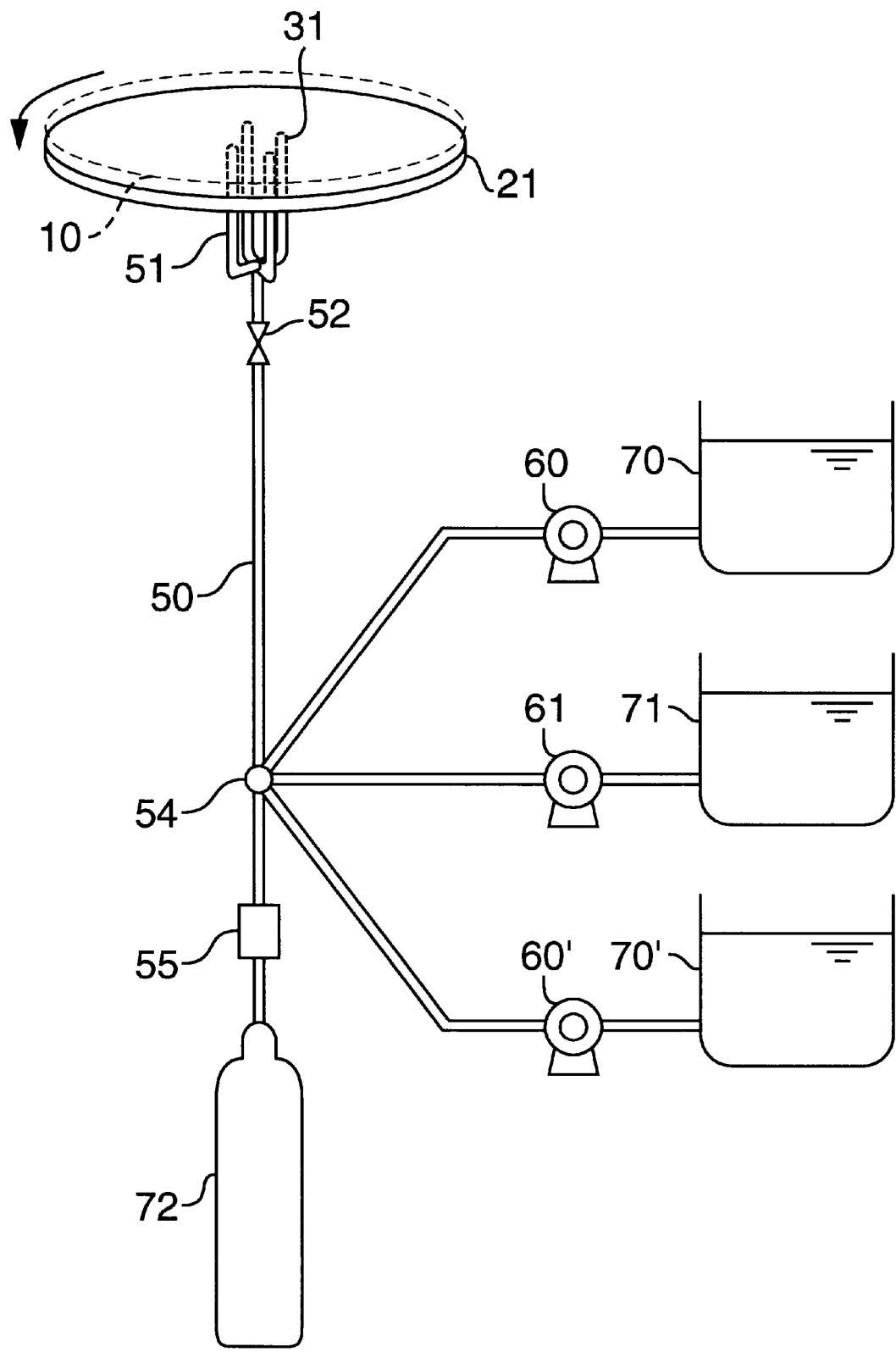
FIG. 17 is an illustration showing the main configuration of one example of a holding and treatment system which can perform washing and nitrogen drying according to the invention.

The system of the embodiment comprises a second wash tank 70' and a second wash tank pump 60' in parallel with a wash liquid tank 70 and an ultrapure tank 71, and a nitrogen gas cylinder 72 in addition to the components of the fifth embodiment, as shown in FIG. 17. In the sixth embodiment, the switch valve 53 used in the fifth embodiment is replaced with a switch valve 54 capable of switching four pipe lines because the tank is added.

In addition to the basic components, the fluid treatment system of the sixth embodiment like the fifth embodiment further includes a treatment tank for including a specimen 10 and a holder 20, a dryer for drying the specimen, a collection device for discarding or collecting spent liquid, and a jig for transporting and passing the specimen (although the members are not shown).

(2) Operation

As shown in FIG. 17, the holder 20 of the embodiment noncontact-holds a specimen 10 in parallel with the specimen hold face of the holder 20 apart about 1–2 mm above the holder 20.

In the fluid treatment method of the embodiment, first the switch valve 54 is opened to the side of the first wash liquid tank 70, then the opening/closing valve 52 is opened for starting a first wash liquid supply, for example, in 2 liters/ minute, whereby the specimen 10 is stably noncontact-held by the Bernoulli effect and the first wash treatment of the hold face of the specimen 10 is executed as in the fifth embodiment.

Next, the switch valve 54 is switched in sequence for supplying ultrapure water, second wash liquid, and ultrapure water one after another for treating the hold face of the specimen 10. The supply amount of each liquid is 2 liters/minute, for example.

Last, the switch valve 54 is switched to the side of the nitrogen gas cylinder 72 for supplying a nitrogen gas, for example, in 20 liters/minute for drying the specimen 10 having been finally rinsed.

Thus, rinse, second wash, rinse, and drying of the hold face of the specimen 10 can be consecutively executed without exposing the surface of the specimen 10 to outside air with the specimen noncontact-held by a single holder.

(3) Performance evaluation

The washing and drying performance of the system of the embodiment was evaluated under the following conditions:

Specimen 10 was prepared by immersing a 6-inch silicon wafer not subjected to surface treatment in an about 0.5% hydrofluoric acid aqueous solution containing silicon powders 0.2 m in particle diameter, then spin-coating a liquid containing predetermined concentration of iron, copper, nickel, and chromium. About 9000 silicon powders and the metallic ions of about $10^{12}$ atoms/cm$^2$ adhered to the wafer surface by the treatment.

In the embodiment, the specimen 10 intentionally contaminated as described above was treated for three minutes as the first washing with an aqueous solution of ammonia water+hydrogen peroxide water constituting about 0.5% by weight and about 2.5% by weight respectively at liquid temperature about 80, next rinsed with ultrapure water for three minutes. Further, the specimen was treated for three minutes as the second washing with an aqueous solution of hydrochloric acid+hydrogen peroxide water constituting about 4.6% by weight and about 0.3% by weight respectively at liquid temperature about 80, next rinsed with ultrapure water for three minutes. Last, the specimen was dried for two minutes with a nitrogen gas.

The washing and drying treatment according to the embodiment removed 99% or more of the silicon powders and metallic ions adherent to the surface of the specimen 10. Further, a water mark, a dry failure Indicator, did not occur either.

According to the embodiment, the specimen can be stably noncontact-held and contaminants adherent to the specimen surface can be removed more efficiently and the specimen can be dried in a good condition.

<Embodiment 7>

A seventh embodiment of the invention will be discussed with reference to FIG. 18.

The seventh embodiment provides a system which comprises the holder 20 described in the sixth embodiment fitted to the arm tip of a known transfer robot. It transfers a specimen 10 held with the holder 20 and can also make treatment such as washing of the held specimen 10.

(1) Configuration

Figure 18:
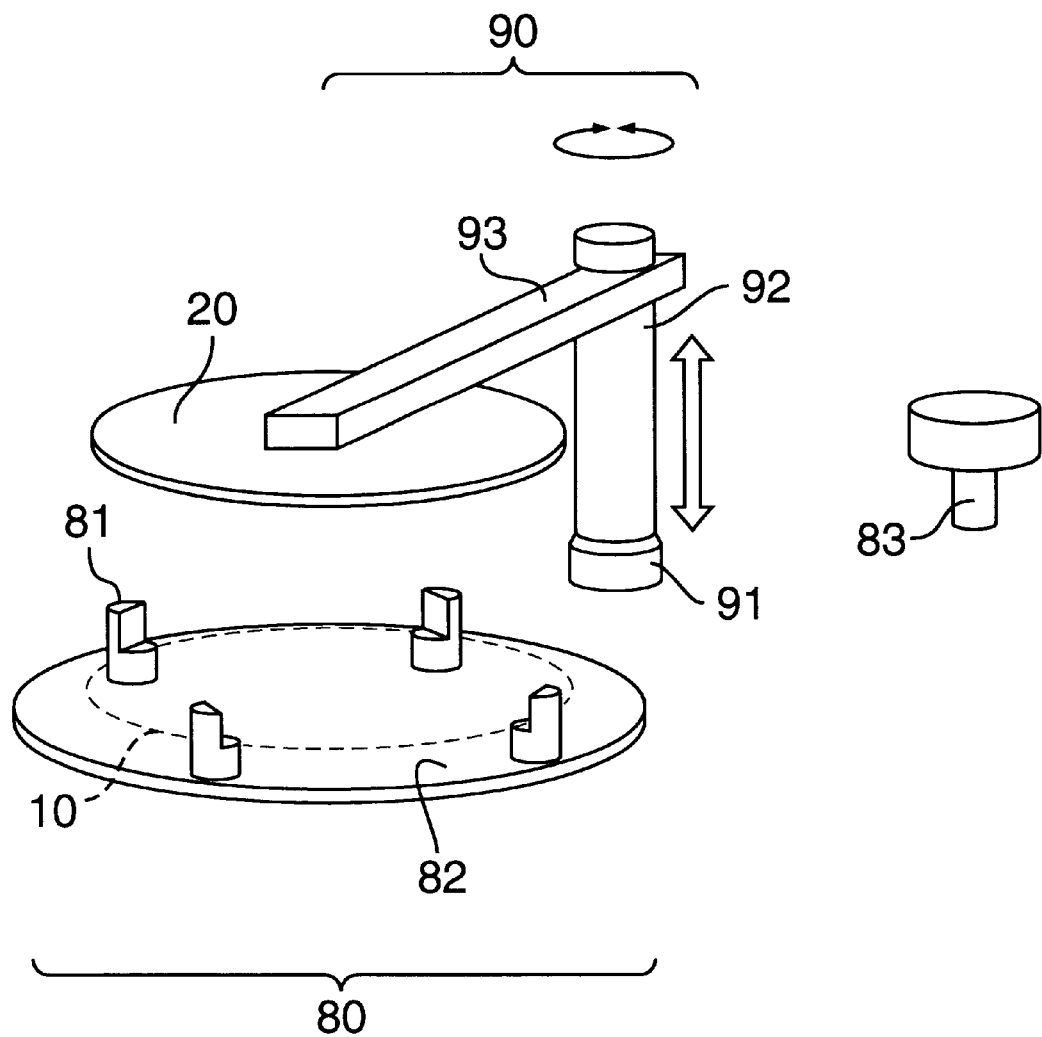
FIG. 18 is an illustration showing the main configuration of one embodiment of a transport, holding, and washing system according to the invention.

As shown in FIG. 18, the system of the embodiment is composed of a specimen support base 80, a transfer robot 90, and a holder 20. A vacuum chuck 83 is a specimen support base of another system.

The specimen support base 80 has a base 82 formed with four holding claws 81 for receiving a specimen 10 indicated by a broken line for covering single wafer processing, The transfer robot 90 consists of a rotary trestle 91, a column 92, and an arm 93; it can perform, for example, 180 or more rotary motion and a vertical move of the arm 93.

The holder 20, which has the structure, for example, shown in the sixth embodiment, is fitted to the tip of the arm 93 of the transfer robot 90 with the specimen hold face of the holder 20 downward.

FIG. 18 shows only the main parts of the system of the embodiment; accessories of the specimen support base 80, vacuum chuck 83, and transfer robot 90, a fluid supply mechanism, etc., are omitted. In the present embodiment, the holder 20 described in the sixth embodiment is used. The other types of the holders described in the preceding embodiments may be used as well.

(2) Operation

In the embodiment, first, the holder 20 is moved to a position about 20 mm above the specimen 10 on the specimen support base 80 by the transfer robot 90. Next, as in the fifth or sixth embodiment, while ultrapure water is being supplied from fluid supply holes (not shown) of the holder 20, the holder 20 is made to fall to a position about 3 mm above the specimen 10 for Bernoulli-holding the specimen 10.

When the specimen 10 is Bernoulli-held with the holder 20, the specimen chuck of the specimen support base 80 is released and the column 92 of the transfer robot 90 is elevated for lifting up the holder 20 noncontact-holding the specimen 10, whereby the specimen 10 is also lifted up together. At the time, even if ultrapure water supply is stopped, the noncontact hold condition of the specimen 10 continues due to the surface tension of ultrapure water.

The specimen 10 is transferred together with the holder 20 to the vacuum chuck 83 by vertical motion and rotation of the transfer robot 90, then mounted on the vacuum chuck 83. After the vacuum chuck 83 is operated corresponding to the operation, the ultrapure water supply to the holder 20 is set to 0.3–1.0 liter/minute so that chuck of the holder 20 is released.

Next, the specimen 10 held by the vacuum chuck 83 is treated by the holder 20. That is, by operating a switch valve, wash liquid is supplied for three minutes in 2 liters/minute for washing the specimen 10, next ultrapure water is supplied for two minutes in 2 liters/minute for rinsing the specimen 10. Last, a nitrogen gas is supplied for two minutes in 30 liters/minute for drying the specimen 10 and the specimen 10 is saved from the vacuum chuck.

(3) Performance evaluation

In the embodiment, we have discussed that the holder 20 for producing the Bernoulli effect serves both as a noncontact holder for transferring the specimen 10 and as a treatment holder for washing, rinsing, and drying.

The noncontact holder function is provided because the holder has a stable holding capability of withstanding acceleration occurring on the specimen 10 by vertical motion and rotation of the arm 93. Although ultrapure water supply for noncontact holding is taken as an example, a nitrogen gas may be jetted for noncontact holding According to the embodiment, the system volume can be drastically reduced by adopting the system serving both as Bernoulli holder with liquid and as liquid treatment system. If a system stopping ultrapure water when a specimen is held or transferred is adopted, about 2-liter ultrapure water can be saved per specimen transferred, for example, in a treatment condition using typical semiconductor substrate wafers as compared with a continuous supply system.

The specimen support bases at the transfer source and destination are not limited to those in the example. The operation function of the upper and lower holders is not limited to that in the example; the upper and lower holders may be replaced with each other. That is, With the upper holder fixed, the lower holder may be able to move vertically.

The transfer sequence and its setup values are not limited to the above-mentioned values either. The transfer robot is not limited to the model shown in FIG. 18 either. If the transfer robot can perform transfer as described above, the drive mode and system thereof are not limited.

<Embodiment 8>

An eighth embodiment of the invention will be discussed.

The eighth embodiment provides a system which treats one face of a specimen by the method described in the fifth or sixth embodiment and treats the other face, for example, by a spray method for enabling simultaneous treatment of both faces of the specimen. The system of the embodiment will be described with reference to FIG. 19, a perspective view of the system of the embodiment.

(1) Configuration

Figure 19:
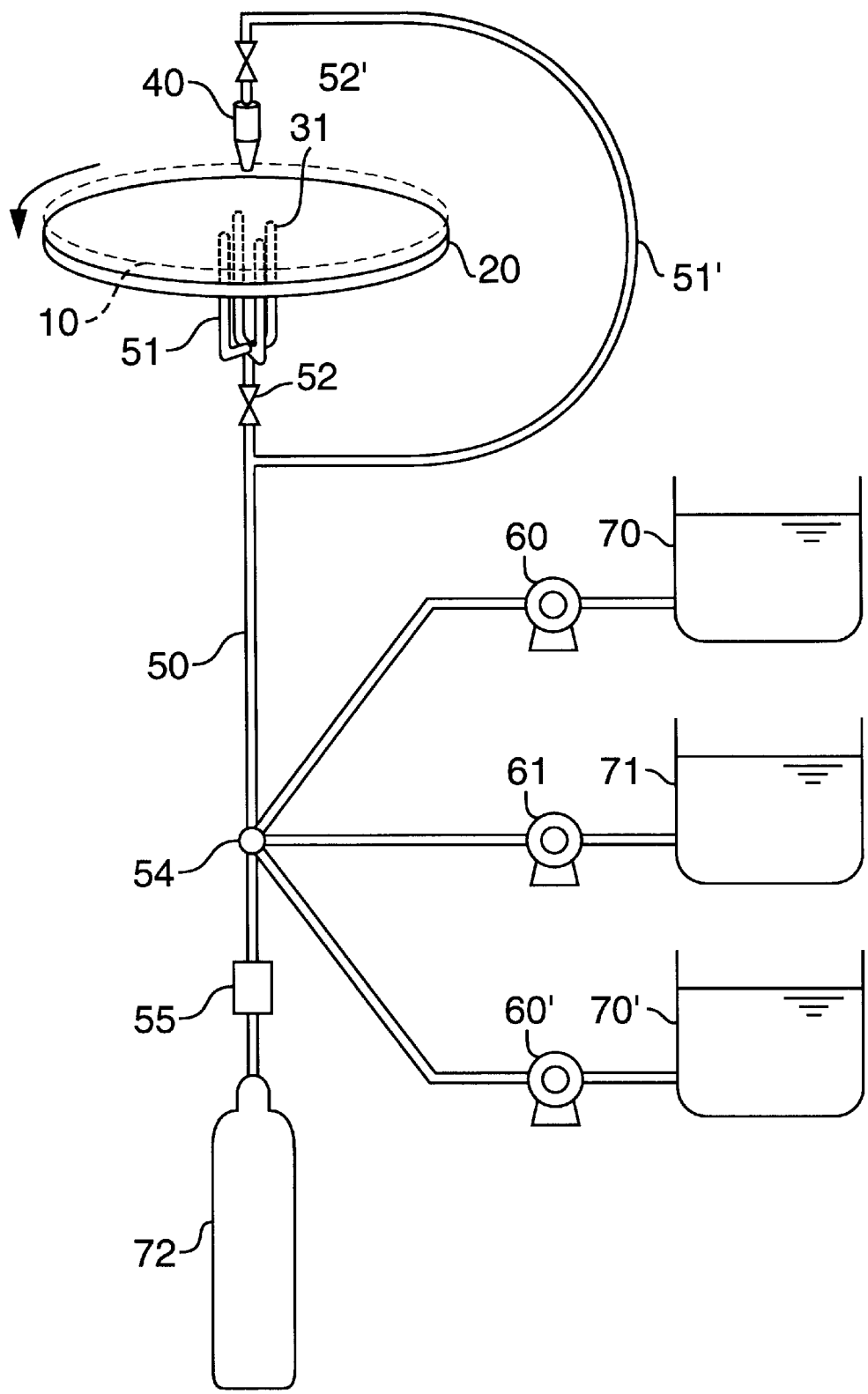
FIG. 19 is an illustration showing the main configuration of one embodiment of a system which can perform Bernoulli holding and spray wash treatment according to the invention.

The system of the eighth embodiment is the same as the system of the sixth embodiment in configuration except that it further includes a spray nozzle 40 and a pipe 51' for connecting the spray nozzle 40 and a pipe 50 as shown in FIG. 19. The spray nozzle 40 is connected by the pipe 51' branching from a fluid supply pipe 50 and placed at a position facing the specimen hold face of a holder 20; it can jet liquid to the rear of a specimen 10.

Fluid jetted from the spray nozzle 40 can be selected as desired by means of the switching valve 54 and the opening/closing valves 52' attached to the pipes 50 and 51'.

FIG. 19 shows only parts directly showing the features of the embodiment. That is, only the holder 20, the spray nozzle 40, fluid supply sources, pipe lines for connecting them, and the specimen 10; a treatment tank including the holder 20, a device for discarding or collecting spent liquid, a jig for transferring and passing the specimen 10, etc., are omitted.

In the embodiment, the holder 20 and the spray nozzle 40 are connected to the same fluid supply source, but need not necessarily be connected to the same source. For example, they may be connected to their respective fluid supply sources. In such a case, however, it is necessary to combine treatment liquids not chemically reacting with each other.

The treatment method of the opposed surface (rear) to the hold face of the specimen 10 (face opposed to the specimen hold face of the holder 20) is not limited to the above-mentioned method. For example, an ultrasonic spray method, a brush scrub method, or Bernoulli treatment using a holder according to the invention may be used. The Bernoulli treatment method will be discussed in the next embodiment.

(2). Operation

In the fluid treatment method of the embodiment, a specimen 10 is noncontact-held by the holder 20 by the method described in the fifth embodiment, then fluid is supplied from the spray nozzle 40 to the rear of the hold face of the specimen 10, whereby the faces of the specimen 10 are treated. The same method as described in the sixth embodiment can be used for the supplied fluid and it switching method.

Fluids supplied from the spray nozzle 40 and the holder 20 may be of the same kind or different kinds. However, to use different kinds of fluids, it is necessary to combine liquids not chemically reacting with each other.

(3) Performance evaluation

According to the embodiment, the surface and rear of the specimen 10 can be treated at the same time. Further, by appropriately selecting the structure of the spray nozzle 40, the rear of the specimen 10 can be treated by means of liquid jetted by powerful energy such as ultrasound, jet flow, or scrub. For example, an ultrasonic vibrator may be fitted to the holder for vibrating fluid and a specimen for furthermore enhancing the washing effect.

<Embodiment 9>

We have discussed use of only one holder in the preceding embodiments. As a ninth embodiment of the invention, an example of a system which can simultaneously treat both faces of a wafer by using two holders between which the wafer as a specimen is sandwiched will be discussed with reference to FIGS. 20A and 20B.

(1) Configuration

Figure 20A:
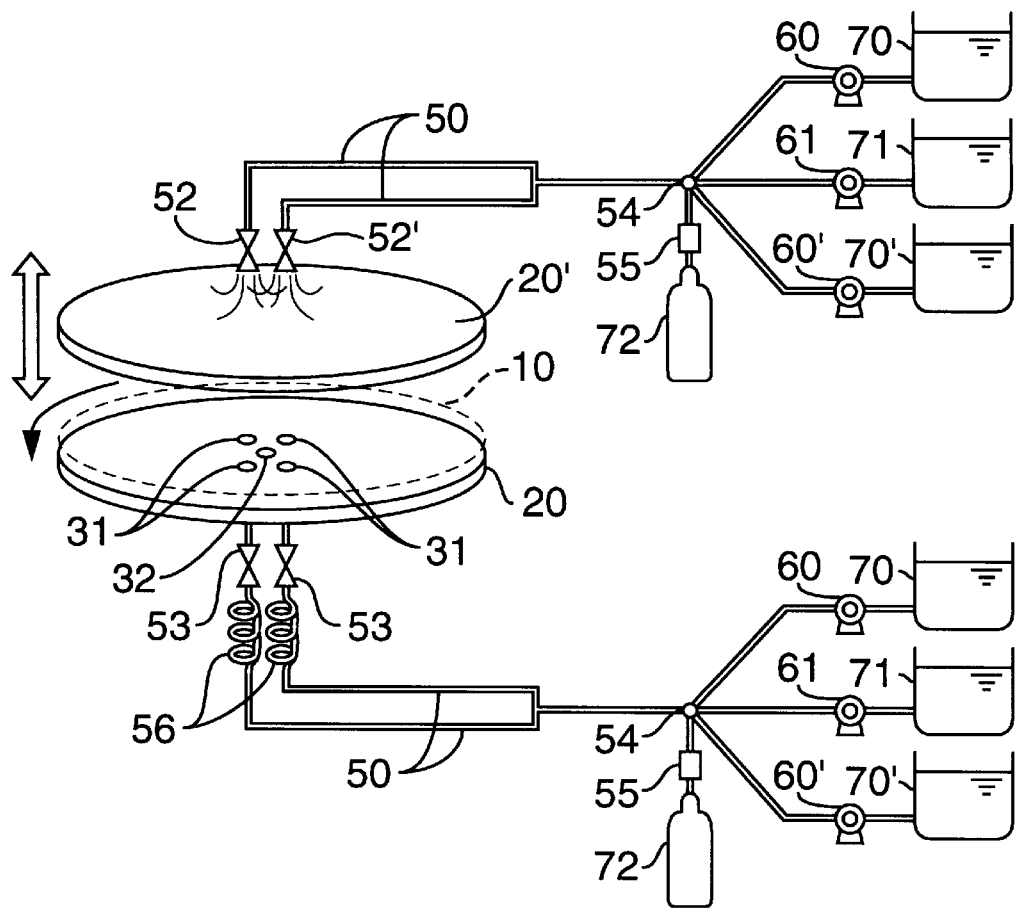
FIG. 20 is an illustration showing the main configuration of one embodiment of a system which can perform upper and lower Bernoulli holding and treatment according to the invention.

The system of the ninth embodiment is the same as the system of the sixth embodiment in the main configuration except that it uses two holders and that it comprises a vertical hole 32 formed at the center of fluid supply holes 31. The two holders 20 and 20' are placed facing each other as shown in FIG. 20A. In the embodiment, the upper holder 20' is fixed and the lower holder 20 is movable.

To make the lower holder 20 movable, pipes 56 connected to the lower holder 20 are made spiral so that it can expand and contract in a desired range, for example, as shown in FIG. 20A.

FIG. 20A shows the parts directly showing the features of the embodiment, namely, the two holders 20 and 20' and pipe lines connected to them to the midway point. Other components of the embodiment such as fluid supply sources, a mechanism for up and down moving the lower holder 20 and a power source thereof, a treatment tank including the two holders, a device for discarding or collecting spent liquid, and a jig for transporting and passing a specimen 10 are not shown.

The movable holder is not limited to the lower holder 20; the upper holder 20' may be made movable or both upper and lower holders may be made movable.

Figure 20B:
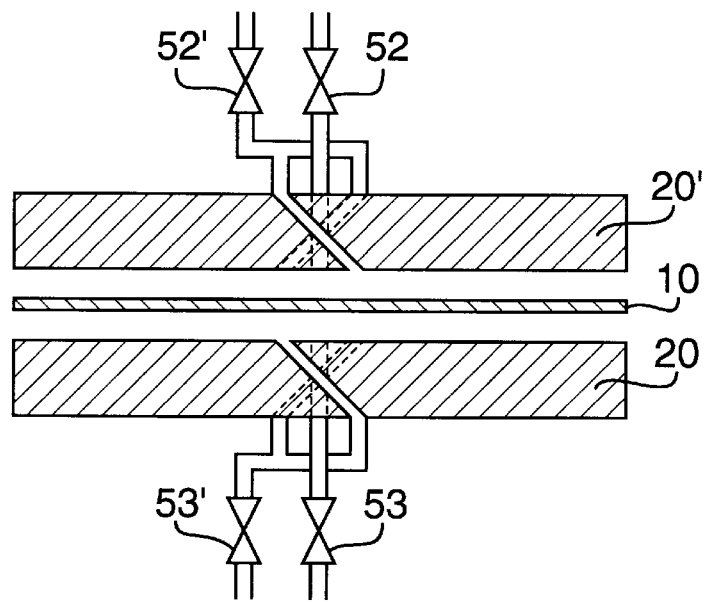

The direction of the angle which each fluid supply hole 31 (tilt hole) for rotating the wafer 10 forms with the specimen hold face of the upper holder is opposed to that of the lower holder, as shown in FIG. 20B, for using one holder to jet fluid for starting rotation of the wafer and the other to jet fluid for controlling the wafer rotation.

Each of the holders 20 and 20' is formed with a vertical hole 32 in addition to the tilt holes 31. The vertical hole 32 is placed at the center of the specimen hold face of the holder. It produces the following two effects:

First, fluid prone to accumulate in the area surrounded by the four tilt holes 31 is made easily to move by jetting fluid from the vertical hole at the same time as fluid is jetted from the tilt holes 31.

Second, while fluid is jetted from the tilt holes 31 of the other holder, fluid is jetted alone from the vertical hole, whereby the holder containing the vertical hole and Bernoulli holding of the specimen are maintained without giving an inverse rotation force to the specimen.

The tilt holes 31 and the vertical holes 32 of the upper and lower holders in the embodiment enable the rotation state of the specimen 10 to be controlled as desired, providing extremely large practical merits.

For example, by experiment using the system in FIG. 20A, a 6-inch wafer rotates about 1100 revolutions/minute by jetting a nitrogen gas of 20 liters/minute from the lower holder 20. In such a condition, even if the valve 53' of the lower holder 20 is closed, the wafer does not stop rotation and it requires 98 seconds in stopping the wafer rotation.

However, the rotation stop time can be reduced to 21 seconds by opening the valve 52' of the holder 20' and jetting a nitrogen gas of 20 liters/minute for five seconds.

(2) Operation

In the fluid treatment method of the embodiment, first the lower holder 20 is saved at a position not hindering loading of a specimen 10. In this condition, the valve 52 is opened and a nitrogen gas is jetted 10 liters/minute for causing the upper holder 20' to noncontact-hold the specimen 10. After this, the lower holder 20 is moved to a position facing the specimen 10 for sandwiching the specimen 10 between the two holders. The specimen 10 rotates in the arrow direction shown in FIG. 20A.

Next, fluids are supplied from the liquid sources to the two holders for treating their respective hold faces. The same method as described in the sixth embodiment can be applied to supplied liquids and liquid switching method. At the end of the treatment, a change is made to a gas source and the valves 52, 53, and 53' are opened for supplying gas to dry the specimen 10.

Next, the valve 53' is closed and the valve 52' is opened for controlling rotation of the specimen 10 to stop it. Next, the valve 53 is also closed and the lower holder 20 is saved at a position not hindering unloading the specimen 10. Last, the valves 52 and 52' are closed and the specimen 10 is unloaded.

In the treatment, fluids supplied to the two holders may be of the same kind or different kinds. However, to use different kinds of fluids, it is necessary to combine fluids not chemically reacting with each other.

(3) Performance evaluation

According to the embodiment, by sandwiching a specimen between two holders, both faces of the specimen can be simultaneously treated while the specimen rotation state is controlled as desired.

<Embodiment 10>

We have discussed use of only one holder or a pair of holders for completing treatment in the holder or holder pair in the preceding embodiments. As a tenth embodiment of the invention, an example of a fluid treatment system which can use two or more sets of holders to transfer a specimen between the holders will be discussed with reference to FIG. 21, a perspective view of the system.

(1) Configuration

Figure 21:
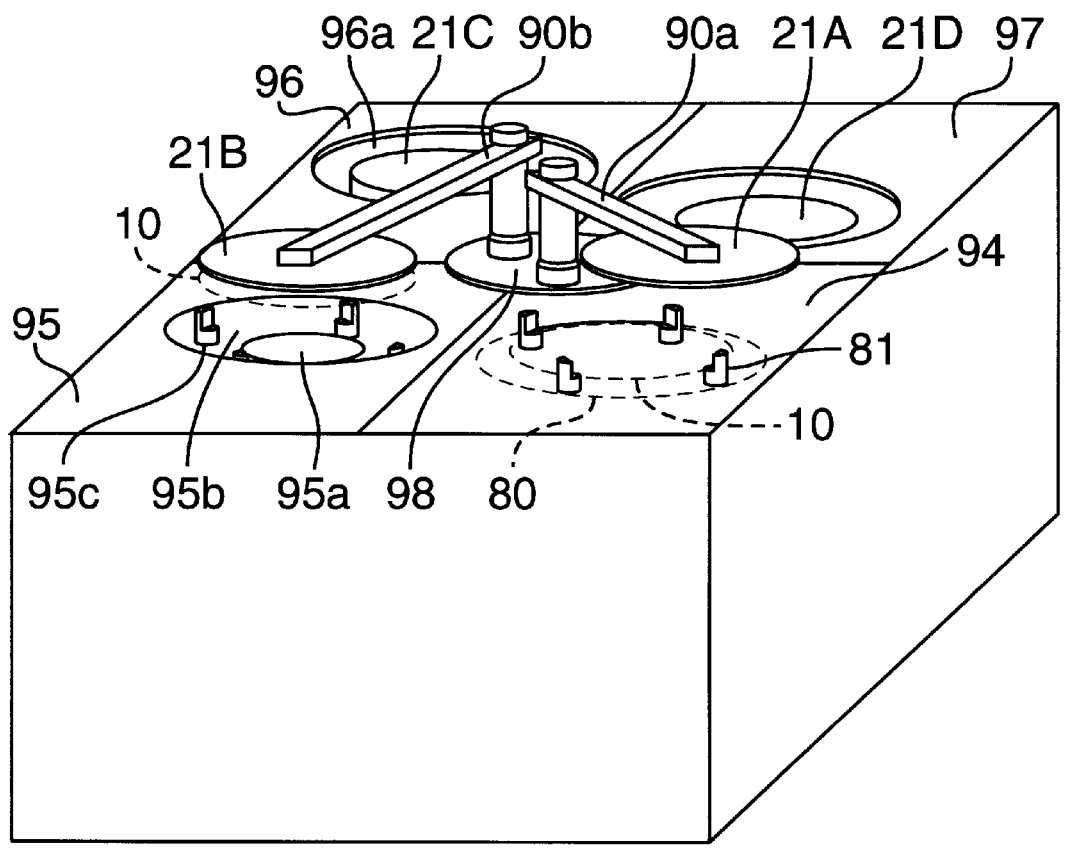
FIG. 21 is an illustration showing the main configuration of one embodiment of a multichamber system using Bernoulli holding and treatment according to the invention.

As shown in FIG. 21, the system of the embodiment comprises a load/unload section 94, a specimen change section 95, a wash/rinse section 96, a drying section 97, and a transfer arm robot section 98.

The load/unload section 94 has a specimen base 80 formed with four specimen hold claws 81. It transfers a specimen to and from an external system (not shown) via the specimen base 80.

The specimen change section 95 consists of four specimen hold claws 95c for holding a specimen 10 and a drain tank 95b provided with a drain outlet 95a for collecting fluid jetted to the specimen 10 when the specimen 10 is changed.

The wash/rinse section 96 has a wash tank 96a and a holder 21C according to the invention installed in the wash tank 96a. It further includes a liquid supply source (not shown) to the holder 21C and a device for discarding or collecting spent liquid (not shown).

The holder 21C is a washing Bernoulli holder formed with a plurality of fluid supply holes 31 for holding a specimen on the top. The fluid supply holes 31 are made so as to form a predetermined angle with the specimen hold face of the holder 21C so as to rotate the held specimen 10 in one direction, for example, as with the holder 20 in the fifth embodiment (see FIG. 13).

The fluid supply holes 31 are connected to a wash liquid supply source 70 (wash liquid tank) and an ultrapure water supply source 71 (ultrapure water tank) and liquid can be supplied from either source by switching a valve 52, for example, as with the liquid supply system described in the sixth embodiment (see FIG. 17).

The drying section 97 has a holder 21D, a gas Bernoulli holder. The holder 21D holds a specimen on the top and contains a temperature rise device for rising the temperature of jetted gas.

The transfer arm robot section 98 has two arm robots 90a and 90b. A holder 21B for holding a specimen on the bottom is fitted to one arm robot 90b. It is a liquid Bernoulli holder connected to the wash liquid and ultrapure water supply sources 70 and 71. The arm robot 90b can move a specimen 10 held by the holder 21B to a position where the specimen 10 faces any of the specimen hold claws 95c of the specimen change section 95, the wash holder 21C of the wash/rinse section 96, and the holder 21D of the drying section 97.

A holder 21A for holding a specimen on the bottom is fitted to the other arm robot 90a. It is a gas Bernoulli holder connected to a nitrogen gas supply source (not shown). The arm robot 90a can transfer a specimen 10 held by the holder 21A from the specimen base 80 of the load/unload section 94 to the specimen hold claws 95c of the specimen change section 95 and from the holder 21D of the drying section 97 to the specimen base 80 of the load/unload section 94. The holder 21A is a gas Bernoulli holder having a similar structure to that of the holder 21D of the drying section 97.

The liquid supply sources, a device for discarding or collecting spent liquid, and a known drive used to drive the transfer arm robot section are built in the bottom of the system of the embodiment, but not shown in FIG. 21 for clarifying the features of the system configuration of the embodiment. A known transfer robot of the load/unload section 94 for transferring specimens to and from an external system, a cover for covering the entire system, and the like are not shown either.

(2) Operation (2-1) Washing and rinsing

A specimen 10 sent from a system outside the system of the embodiment is mounted on the specimen base 80 of the load/unload section 94. The specimen 10 mounted on the specimen base 80 is noncontact-held by the gas holder 21A and transferred to the specimen change section 95 by the transfer operation of the arm robot 90a and placed on the specimen hold claws 95c.

After the holder 21A is saved, the specimen is held, for example, by the method described in the seventh embodiment (see FIG. 18) by the liquid holder 21B fitted to the arm robot 90b. After this, the specimen is transferred to a position about 5 mm above the washing holder 21C installed in the wash tank 96a of the wash and rinse section 96.

To clarify the positional relationship among the holders contained in the system of the embodiment, in the description that follows, the holders 21A and 21B holding a specimen on the bottom will be referred to as upper holders and the holders 21C and 21D holding a specimen on the top will be referred to as lower holders.

As the specimen 10 approaches, wash liquid supply is started from the lower washing holder 21C and the upper holder 21B for performing Bernoulli washing of both faces of the specimen 10, for example, by the method described in the ninth embodiment illustrated in FIG. 20.

After the washing ends, the liquids supplied from both the upper and lower holders 21B and 21C are changed to ultrapure water for rinsing the specimen.

(2-2) Drying

After the rinsing ends, ultrapure water supply to the lower holder 21C is lowered to a chuck release amount, and release the chuck of the lower holder 21C. The specimen 10 is noncontact-held only by the upper holder 21B. After this, ultrapure water supply from the upper holder 21B is also stopped. In this condition, if the arm robot 90b is operated for elevation, the specimen 10 held with the upper holder 21B is also lifted up together.

This is because although the ultrapure water supply stops, the specimen 10 is stably held with the upper holder 21B due to the surface tension of the liquid remaining on the interface between the specimen 10 and the upper holder 21B. Further, the arm robot 90b is operated for transferring the specimen 10 to a position above the lower drying holder 21D in a drying tank of the drying section.

When the specimen 10 comes to a position about 5 mm above the lower drying holder 21D, a heated nitrogen gas is jetted from the lower holder 21D and at the same time, ultrapure water of an amount releasing chuck of the specimen 10 is supplied from the holder 21B, whereby the specimen 10 is held with the lower holder 21D.

After the upper holder 21B is saved from the drying section 97, the arm robot 90a is operated for moving the upper holder 21A to a position above the specimen 10 held with the lower holder 21D of the drying section 97. Next, heated nitrogen gas spraying to the specimen 10 is also started from the upper holder 21A for drying both faces of the specimen with the upper and lower holders 21A and 21D.

After the drying ends, the specimen 10 is held by the upper holder 21A and the arm robot 90a is operated for transferring the specimen 10 to the specimen base 80 of the load/unload section 94. The treatments for the specimen 10 are now complete.

(3) Performance evaluation

According to the embodiment, the upper holder 21B for washing and rinsing, which also serves as a transfer device of the specimen 10, produces the effect of reducing the volume of the entire system and the effect of completing the treatment without exposing the wafer as the specimen to air. The upper holder 21A, which has both transfer holding and drying functions, also produce similar effects. Treatment liquid spent as fluid can be efficiently collected and reused by using a plurality of holders.

Further, the system of the embodiment is connected, for example, to the stage preceding a single wafer processing film formation system or heat treatment system, whereby prewashing and specimen transfer after washing required for film formation processing or heat treatment and subsequent film formation processing or heat treatment can be performed consecutively in sequence.

Likewise, the system of the embodiment is connected, for example, to the stage following a single wafer processing ion implantation processing or etching treatment, whereby ion implantation processing or etching treatment and its subsequent processing can also be performed consecutively in sequence.

Further, a larger number of steps can be performed as single wafer processing by adopting the specimen holding and treatment system according to the embodiment for a semiconductor device manufacturing process. Particularly, if prewashing is performed by the system according to the embodiment, the standby time from prewashing to single wafer processing is reduced and also becomes constant. Therefore, according to the semiconductor manufacturing method to which the invention is applied, surface change with time in the processing standby time is reduced and also becomes constant, so that defects and characteristic variations caused by the surface change with time can be reduced.

Although Bernoulli treatment is used for both faces of a specimen in washing and rinsing in the embodiment, another washing means, such as spray washing as illustrated in the eighth embodiment, may also be used for one face of a specimen. Bernoulli treatment with a heated nitrogen gas is used as the specimen drying method in the embodiment, but another drying means, such as spin drying, may also be used.

Although, in the above embodiment 1–10, the systems for noncontact-holding the specimen and treatments with fluids are discussed, the invention can also applied to a specimen transfer system which enable to transfer the specimen of disc shape or rectangular plate shape without having any contact.

Figure 22A:
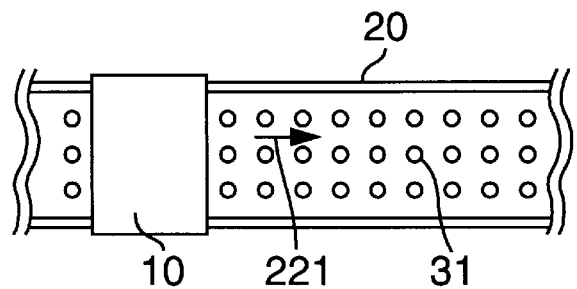
FIG. 22A is an illustration showing the structure of one embodiment of a holder from the top.
Figures 22B, 22C:
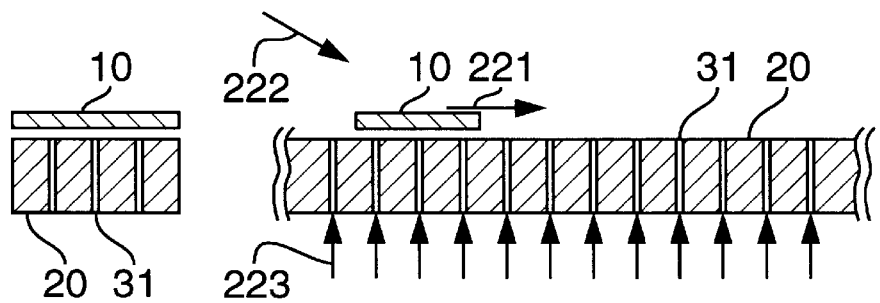
FIG. 22B is a sectional side view showing one example of the structure of a holder in FIG. 22A.
FIG. 22C is a sectional front view showing one example of the structure of a holder in FIG. 22A.

The specimen transfer system of the invention is, for example, as shown in FIG. 22A–22C, a device that square or rectangular plate-like specimen 10 is transferred to a transfer direction 221, comprising of a holding guide 20 with transfer path surface 224 with a plurality of fluid supply holes 31. Bernoulli effect are induced between the specimen 10 and the transfer path surface 224 by providing fluid through the fluid supply holes 31 and jetting the fluid in the direction 223.

According to the specimen transfer system mentioned the above, the specimen 10 is noncontacting held above the transfer path surface 224, and kept in a state where the specimen is free to move to the transfer direction. The specimen in the above state can be moved and transferred for example by jetting the fluid to the specimen surface in the direction 222. The fluid used here can be the same or different type with the fluid supplied to the fluid supply holes 31.

The meniscus is formed between the specimen 10 and the transfer path surface 224. The meniscus induces the inhibition force which suppress the lateral shift of the specimen relative to the holding guide 20 in a direction orthogonal to the transfer direction 221 as explained in the preceding embodiments. Therefore the specimen 10 can be transferred keeping a stable noncontacting state on the transfer path surface 224.

Figure 23A:
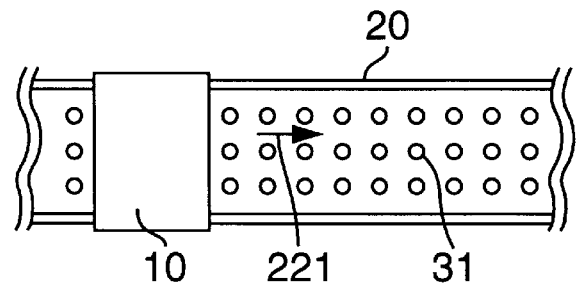
FIG. 23A is an illustration showing the structure of one embodiment of a holder from the top.
Figure 23B:
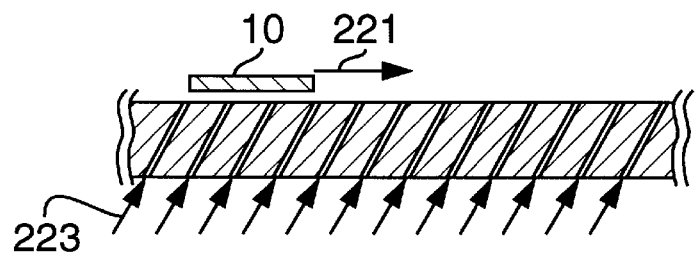
FIG. 23B is a sectional side view showing one example of the structure of a holder in FIG. 23A.

The specimen transfer system of the invention may also comprises, as shown in FIG. 23A, 23B, the holding guide 20 with slant angled fluid supply holes 31. The fluid supply holes 31 are shaped so that the axial direction of the holes relative to the transfer path surface 224 become a predetermined value. According to the above configuration, the specimen 10 can be moved and transferred to the transfer direction 221 by jetting fluid through the above mentioned fluid supply holes 31.

As described above in detail, the first to fourth objects can be accomplished according to the invention. That is, the specimen holding method and system which can stably noncontact-hold a specimen can be provided by making the Bernoulli effective region of a Bernoulli holder almost the same form as a specimen.

Also, the fluid treatment method and system which can treat the surface of a specimen without exposing the specimen to air with the specimen Bernoulli-held by using desired fluid as fluid used in specimen holding in the invention. Further, according to the invention, a fluid treatment system that can execute physical and chemical treatments with fluid as highly pure single wafer processing and can also be miniaturized can be provided.

What is claimed is:

1. A fluid treatment system for treating, a first surface of a specimen with the specimen noncontact-held by causing fluid to flow between the specimen to be held and a specimen hold face opposed to the specimen, said system comprising:

specimen hold means formed with the specimen hold face; and fluid supply means for causing fluid to flow between the specimen hold face and the first surface of the specimen for producing the Bernoulli effect and supplying fluid for treating the first surface of the specimen, the specimen hold face having a region surrounded by boundaries formed on the specimen hold face where the magnitude of tension acting between the outer peripheral surface of the held specimen and the specimen hold face rapidly changes, the region having almost the same size as the specimen in a direction where relative shift of the specimen to the specimen hold face should be suppressed, wherein said fluid supply means is composed of a plurality of means for supplying different fluids, further including selection means for selecting one of said plurality of supply means and supplying fluid from the selected supply means to the specimen hold face, wherein said plurality of supply means include at least means for supplying liquid used in a liquid treatment process of the specimen to be held and means for supplying gas used in a gas treatment process of the specimen to be held, and wherein the liquid treatment process includes at least a washing step with wash water and the gas treatment process includes at least a drying step with a drying gas, and wherein said system comprises a means for providing liquid to a second surface of the specimen for cleaning the second surface and a means for providing gas to the second surface of the specimen for drying the second surface.

2. The fluid treatment system as claimed in claim 1 wherein said liquid supply means supplies at least either of pure water and a predetermined wash liquid; and wherein said gas supply means supplies a nitrogen gas.

3. A fluid treatment system for treating a first surface of a specimen with the specimen noncontact-held by causing fluid to flow between the specimen to be held and a specimen hold face opposed to the specimen, said system comprising:

specimen hold means formed with the specimen hold face; and fluid supply means for causing fluid to flow between the specimen hold face and the specimen for producing the Bernoulli effect and supplying fluid for treating the first surface of the specimen, the specimen hold face having a region surrounded by boundaries formed on the specimen hold face where the magnitude of tension acting between the outer peripheral surface of the held specimen and the specimen hold face rapidly changes, the region having almost the same size as the specimen in a direction where relative shift of the specimen to the specimen hold face should be suppressed, further including means for moving a position of said specimen hold means with the specimen held on the specimen hold face, and wherein said system comprises a means for providing liquid to a second surface of the specimen for cleaning the second surface and a means for providing gas to the second surface of the specimen for drying the second surface.

4. A fluid treatment system for treating a first surface of a specimen with the specimen noncontact-held by causing fluid to flow between the specimen to be held and a specimen hold face opposed to the specimen, said system comprising:

specimen hold means formed with the specimen hold face; and fluid supply means for causing fluid to flow between the specimen hold face and the specimen for producing the Bernoulli effect and supplying fluid for treating the first surface of the specimen, the specimen hold face having a region surrounded by boundaries formed on the specimen hold face where the magnitude of tension acting between the outer peripheral surface of the held specimen and the specimen hold face rapidly changes, the region having almost the same size as the specimen in a direction where relative shift of the specimen to the specimen hold face should be suppressed, wherein a pair of said specimen hold means are provided, further including means for supporting said paired specimen hold means so that the specimen hold faces formed in said paired specimen hold means are placed facing each other in a predetermined spacing with the specimen between, and wherein said system comprises a means for providing liquid to a second surface of the specimen for cleaning the second surface and a means for providing gas to the second surface of the specimen for drying the second surface.

5. The fluid treatment system as claimed in claim 4 wherein a pair of said fluid supply means are provided for suppling fluid to said paired specimen hold means are provided, further including means for selecting fluid supplied from each fluid supply means to its corresponding specimen hold means in response to treatment executed on each face of the specimen opposed to the specimen hold face formed in each specimen hold means.

6. The fluid treatment system as claimed in claim 4 wherein a plurality of sets of said specimen hold means and said fluid supply means for supplying fluid to said specimen hold means are provided in response to a plurality of treatment steps executed for the specimen, further including transport means comprising said specimen hold means, said fluid supply means, and means for moving locations of said specimen hold means for transporting the specimen among said plurality of specimen hold means, said fluid supply means in each set for supplying fluid used in each of said plurality of treatment steps, said transport means for transporting the specimen among said plurality of specimen hold means so as to treat the specimen in the order of said plurality of treatment steps.

7. A plate-like specimen having a surface treated with fluid, wherein fluid selected in response to treatment to be executed for said plate-like specimen is caused to flow between said plate-like specimen and a specimen hold face placed facing said plate-like specimen for executing the treatment on the surface of said plate-like specimen, and wherein the treatment used is a fluid treatment method for treating a surface of a specimen with the specimen noncontact-held using the Bernoulli effect produced by causing fluid to flow between the specimen to be held and a specimen hold face opposed to the specimen, said method comprising the steps of:

selecting a fluid caused to flow for producing the Bernoulli effect in response to treatment to be executed for the specimen to be held; and causing the selected fluid to flow into the specimen hold face having a region surrounded by boundaries formed on the specimen hold face where the magnitude of tension acting between the outer peripheral surface of the held specimen and the specimen hold face rapidly changes, the region having almost the same size as the specimen in a direction where relative shift of the specimen to the specimen hold face should be suppressed, for noncontact-holding the specimen and executing the treatment of the specimen surface.

* * * * *